(12) United States Patent
Ho

(10) Patent No.: US 12,369,378 B2
(45) Date of Patent: Jul. 22, 2025

(54) METHODS FOR DOPING SEMICONDUCTORS IN TRANSISTORS

(71) Applicant: Taiwan Semiconductor Manufacturing Company, Hsinchu (TW)

(72) Inventor: Po-Hsun Ho, Kaohsiung (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 565 days.

(21) Appl. No.: 17/826,298

(22) Filed: May 27, 2022

(65) Prior Publication Data
US 2023/0387252 A1 Nov. 30, 2023

(51) Int. Cl.
H01L 29/66 (2006.01)
H10D 30/62 (2025.01)
H10D 62/13 (2025.01)
H10D 64/01 (2025.01)

(52) U.S. Cl.
CPC ....... H10D 64/017 (2025.01); H10D 30/6219 (2025.01); H10D 62/151 (2025.01); H10D 64/015 (2025.01)

(58) Field of Classification Search
CPC .......... H01L 29/66545; H01L 29/0847; H01L 29/41791; H01L 29/6653
See application file for complete search history.

(56) References Cited

U.S. PATENT DOCUMENTS

2019/0148499 A1* 5/2019 Lin ................. H01L 29/861
   257/288
2021/0104607 A1* 4/2021 Tanaka ............... H01L 21/20

* cited by examiner

Primary Examiner — Dale E Page
Assistant Examiner — Colleen E Snow
(74) Attorney, Agent, or Firm — Lippes Mathias LLP

(57) ABSTRACT

Methods for making transistors with a semiconducting monolayer and low contact resistance are disclosed. The source/drain terminals are on opposite sides of the semiconducting monolayer from the gate terminal. The contact and/or spacer regions of the semiconducting monolayer are covered with a dopant layer on the surface opposite the source/drain terminals. The gate dielectric layer directly contacts the semiconducting monolayer. The resulting structure maintains high mobility in the semiconducting layer and has low contact resistance.

20 Claims, 27 Drawing Sheets

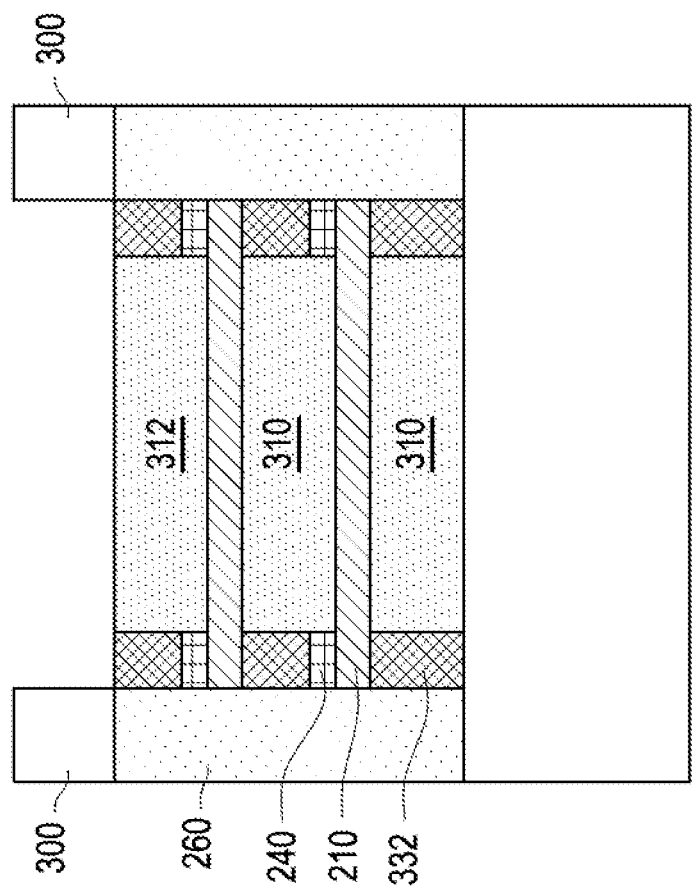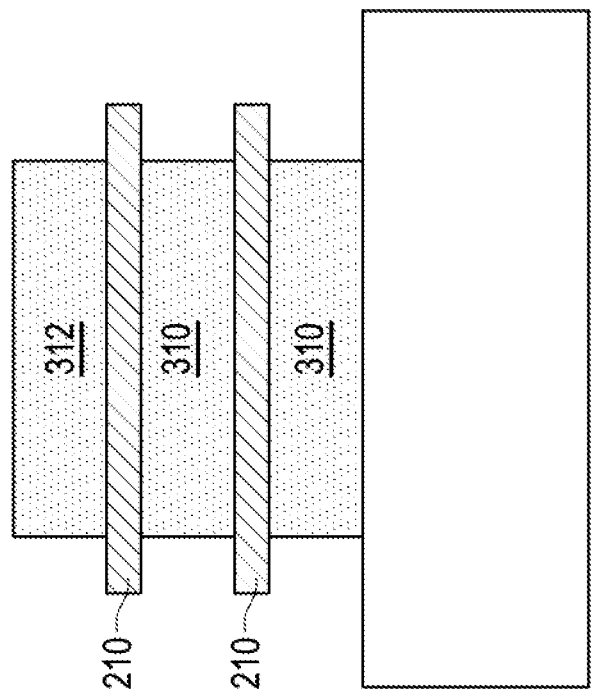
FIG. 7P
FIG. 7Q

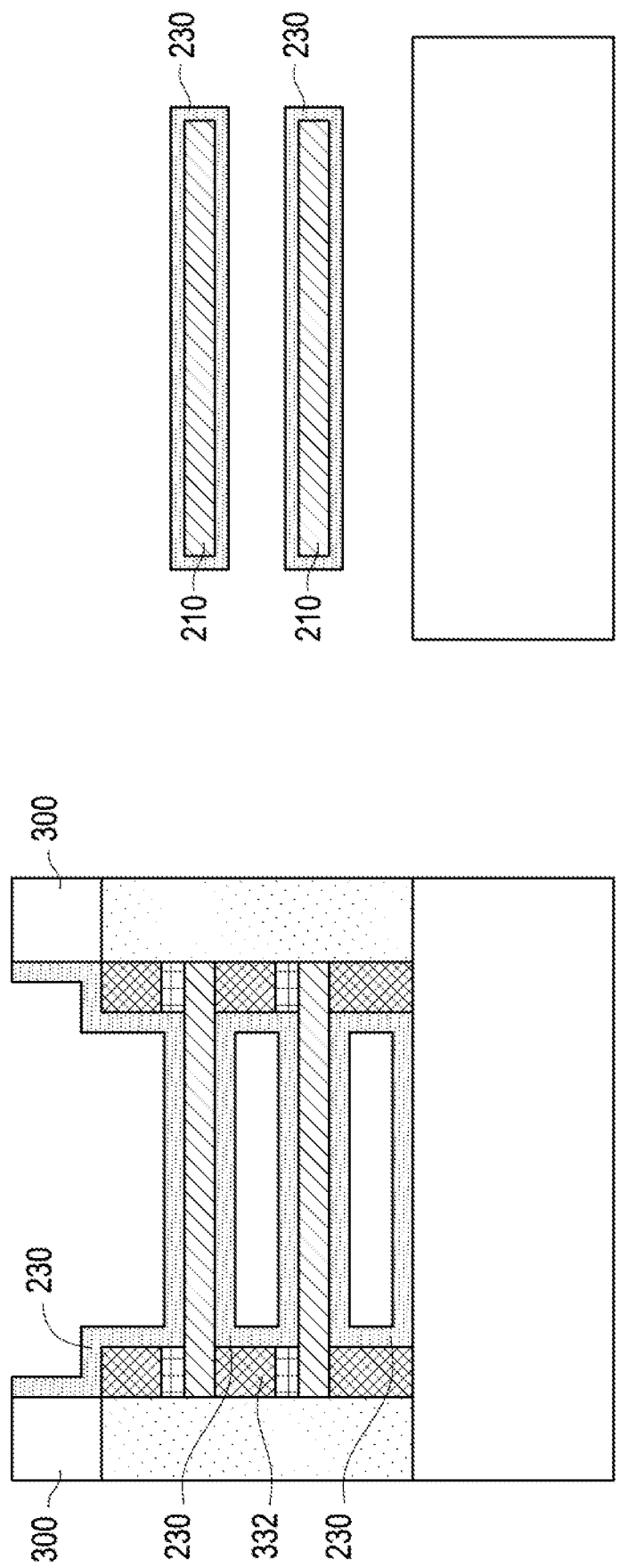

METHODS FOR DOPING SEMICONDUCTORS IN TRANSISTORS

BACKGROUND

An integrated circuit is made of large numbers of transistors. A field-effect transistor is generally composed of a substrate on which an electrically conductive gate terminal controls the flow of current between a source terminal and a drain terminal. An electrically insulating gate dielectric layer separates the gate terminal from the source and drain terminals. A semiconducting layer bridges the source and drain electrodes, and is in contact with the gate dielectric layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
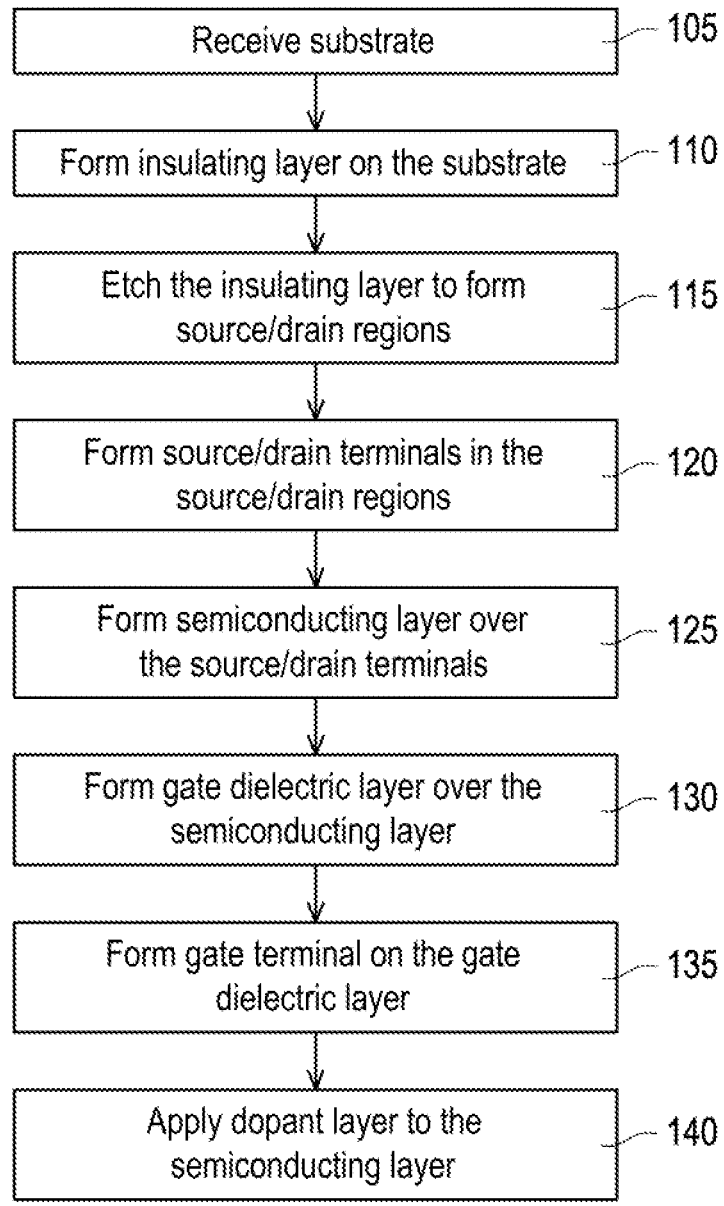
FIG. 1 is a flow chart illustrating a first method for making a transistor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to transistors which are made up of different layers. When the terms "on" or "upon" are used with reference to two different layers (including the substrate), they indicate merely that one layer is on or upon the other layer. These terms do not require the two layers to directly contact each other, and permit other layers to be between the two layers. For example all layers of the transistor can be considered to be "on" the substrate, even though they do not all directly contact the substrate. The term "directly" may be used to indicate two layers directly contact each other without any layers in between them.

The present disclosure relates to methods for producing transistors having very thin semiconducting layers and very low contact resistance. Very thin semiconducting layers, such as monolayers, can provide an ultrathin body without dangling bonds. Performance may suffer due to large contact resistance between the metals used to form the source/drain terminals and the semiconducting monolayer. Thus, in the present disclosure, a bottom-contact structure is used, with the source/drain terminals below the semiconducting monolayer. A dopant layer is applied to the contact regions and/or the spacer regions of the semiconducting monolayer, on the upper surface of the semiconductor monolayer, or the surface which is opposite that of the source/drain terminals. This reduces the contact resistance without blocking the transport path between the source/drain terminals and the semiconducting layer. As a result, the performance of the resulting transistor is greatly improved.

FIG. 1 is a flow chart illustrating a first method 100 for making a transistor, in accordance with some embodiments of the present disclosure. FIGS. 2A-2E illustrate various steps of the first method, and these figures are discussed together. These figures are illustrated with reference to a top-gate transistor.

Referring now to FIG. 1, in step 105, a substrate is received or provided. The substrate is usually a wafer made of a semiconducting material. Such materials can include silicon, for example in the form of crystalline Si or polycrystalline Si. The substrate can also be made from other elementary semiconductors such as germanium or $Al_2O_3$ (sapphire), or may include a compound semiconductor such as silicon carbide (SiC), gallium nitride (GaN), gallium arsenide (GaAs), indium arsenide (InAs), and indium phosphide (InP).

Figure 2A:
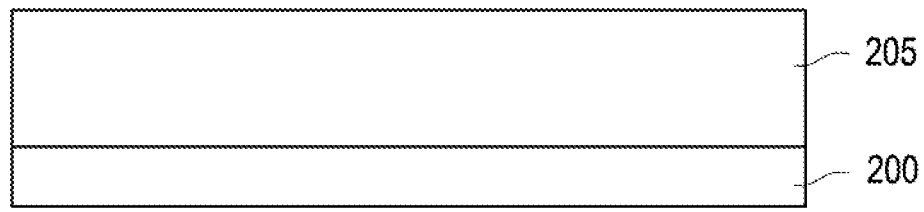
FIGS. 2A-2E illustrate various cross-sectional views of intermediate stages for forming the transistor as described in FIG. 1.

Next, in step 110, an insulating layer is formed upon the substrate. The insulating layer is electrically insulating. The insulating layer may be formed using processes such as thermal oxidation, atomic layer deposition (ALD) or chemical vapor deposition (CVD), including plasma-enhanced atomic layer deposition (PEALD) or plasma-enhanced chemical vapor deposition (PECVD). The insulating layer may be formed from silicon dioxide ($SiO_2$), but is more desirably made of a high-k dielectric material (which has a dielectric constant greater than 3.9). In some embodiments of the present disclosure, the high-k dielectric material has a dielectric constant higher than 5, or higher than 7, or higher than 10. Examples of suitable high-k dielectric materials include silicon nitride ($Si_3N_4$), silicon carbide (SiC), hafnium dioxide ($HfO_2$), zirconium dioxide ($ZrO_2$), aluminum oxide ($Al_2O_3$), silicon oxynitride ($SiO_xN_y$) hafnium oxynitride ($HfO_xN_y$) or zirconium oxynitride ($ZrO_xN_y$), or hafnium silicates ($ZrSi_xO_y$) or zirconium silicates ($ZrSi_xO_y$) or silicon carboxynitride ($SiC_xO_yN_z$), or hexagonal boron nitride (hBN). FIG. 2A illustrates the result of this step, with a substrate 200 and an insulating layer 205 deposited on the substrate.

Continuing, next, a photoresist layer is deposited and patterned. This is done by exposing the photoresist to patterned light, and then developing the photoresist to obtain a patterned photoresist layer. In step 115, the insulating layer is then etched to form source/drain regions 262 within the insulating layer.

Generally, any etching step used herein may be performed using wet etching, dry etching, or plasma etching processes such as reactive ion etching (RIE) or inductively coupled plasma (ICP), as appropriate. The etching may be anisotropic. Depending on the material, etchants may include carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), trifluoromethane ($CHF_3$), carbon fluorides, nitrogen ($N_2$), hydrogen ($H_2$), oxygen ($O_2$), argon (Ar), xenon (Xe), xenon difluoride ($XeF_2$), helium (He), carbon monoxide (CO), carbon dioxide ($CO_2$), fluorine ($F_2$), chlorine ($Cl_2$), oxygen ($O_2$), hydrogen bromide (HBr), hydrofluoric acid (HF), nitrogen trifluoride ($NF_3$), sulfur hexafluoride ($SF_6$), boron trichloride ($BCl_3$), ammonia ($NH_3$), bromine ($Br_2$), nitrogen trifluoride ($NF_3$), or the like, or combinations thereof in various ratios.

Figure 2B:
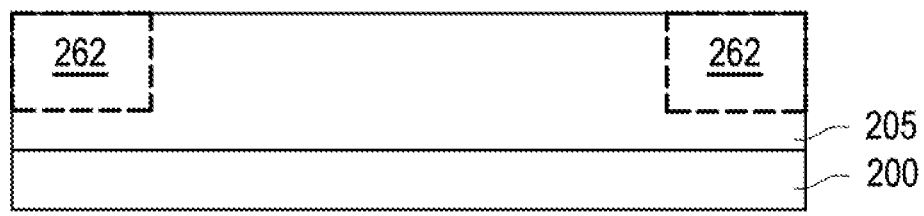

The patterned photoresist layer is then removed. FIG. 2B illustrates the result after this etching step.

In step 120, source/drain terminals 260 are formed in the source/drain regions via deposition of an appropriate electrically conductive material. The material used for the source/drain terminals 260 may be any suitable electrically conductive material. Examples of such materials may include metals such as TiN, Pt, Au, Co, Rh, Pd, Bi, Ti, Ta, and the like. The material may be deposited, for example, via evaporation or sputtering, plating, ALD, CVD, or other suitable methods. Chemical-mechanical planarization (CMP) may be used to remove excess deposited material.

Figure 2C:
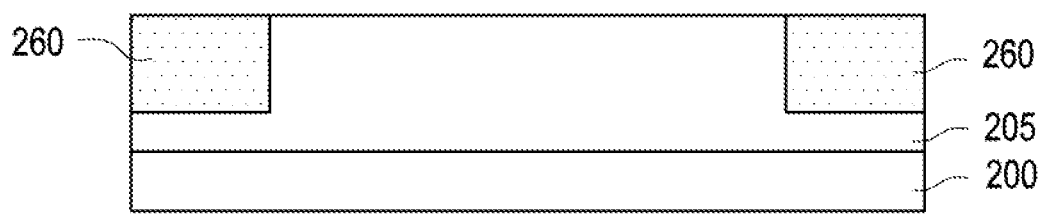

FIG. 2C illustrates the result after this source/drain formation step. The source/drain terminals 260 are embedded within the insulating layer 205. The source/drain terminals may have a thickness 265 of about 5 nanometers to about 100 nanometers. It is noted that the resulting surface is very smooth, which provides a good contact surface for producing a semiconducting monolayer.

Figure 2D:
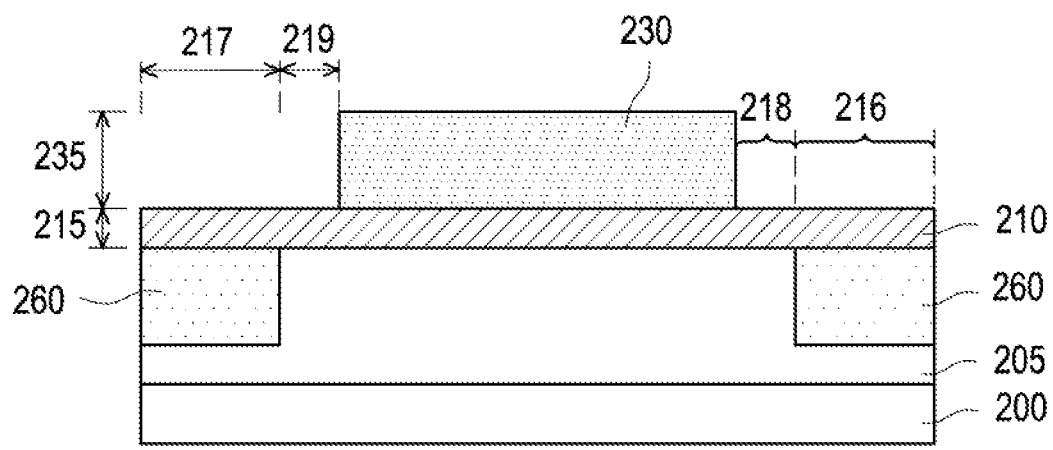

Next, in step 125 and as illustrated in FIG. 2D, a semiconducting layer 210 is formed on the substrate, over the source/drain terminals 260. In more specific embodiments of the present disclosure, the semiconducting layer is a monolayer. Examples of suitable materials for a semiconducting monolayer include transition metal dichalcogenides such as $MoS_2$, $MoSe_2$, $WS_2$, $WSe_2$, $SnS_2$, and $ReS_2$, or other materials such as InSe, phosphorene, tellurene, or graphene. The semiconducting layer can be formed using processes such as atomic layer deposition (ALD) or chemical vapor deposition (CVD). In some alternative embodiments, the semiconducting layer is first produced on a separate surface. The semiconducting layer is then removed from the separate surface and transferred for placement upon the substrate. The semiconducting layer can be further etched to obtain the desired shape and structure.

Next in step 130, a gate dielectric layer 230 is formed upon the semiconducting layer. The gate dielectric layer can be made using the same materials and methods as previously described for the insulating layer. The gate dielectric layer can be further etched to obtain the desired shape and structure. In particular embodiments, the gate dielectric layer comprises $HfO_2$, $ZrO_2$, $Al_2O_3$, $Y_2O_3$, $ErO_2$, hexagonal boron nitride (hBN), hafnium oxynitride, or zirconium oxynitride.

FIG. 2D illustrates the result after this step. In particular embodiments, the semiconducting layer 210 may have a thickness 215 of about 0.5 nanometers to about 10 nanometers, including from about 0.5 nanometers to about 1.0 nanometers. In particular embodiments, the gate dielectric layer 230 may have a thickness 235 of about 0.5 nanometers to about 50 nanometers. The regions 216 where the semiconducting layer 210 overlaps the source/drain terminals are also called contact regions. The regions 218 of the semiconducting layer between the source/drain terminals 260 and the gate dielectric layer 230 are also called spacer regions. In some embodiments, the contact region 216 has a length 217 of about 3 nanometers to about 500 nanometers. In some embodiments, the spacer region 218 has a length 219 of about 1 nanometer to about 100 nanometers. In other embodiments, the gate dielectric layer 230 is formed such that no spacer region 218 is present, or in other words so length 219 is zero.

Figure 2E:
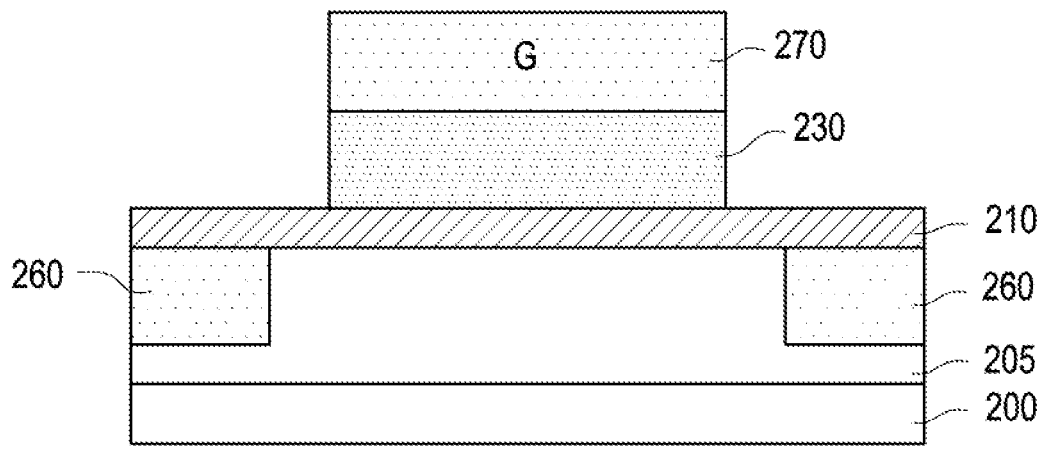

Continuing, another patterned photoresist layer may be applied, as previously described. In step 135, a gate terminal 270 is then formed upon the gate dielectric layer 230. The gate terminal can be made using the same materials and processes as previously described for the source/drain terminals. The patterned photoresist layer is then removed. FIG. 2E illustrates the result after this step. As illustrated here, the gate terminal 270 is formed such that its edges are aligned with the edges of the gate dielectric layer 230, however this is not required.

Next, in step 140, a dopant layer 240 is applied to the semiconducting layer 230. The dopant layer is formed from n-type or p-type dopants, and greatly reduces the contact resistance of the semiconducting layer. For example, n-type dopants may include a silicon oxynitride ($SiON_x$), a titanium oxide ($TiO_x$), an aluminum oxide ($AlO_x$), cesium carbonate, polyethyleneimine, or benzyl viologen. Non-limiting examples of p-type dopants may include $MoO_3$, $WO_3$, $V_2O_5$, $AuCl_3$, $HAuCl_4$, 2,3,5,6-tetrafluoro-7,7,8,8-tetracyanoquinodimethane (F4TCNQ), bis(trifluoromethanesulfonyl)amide (TFSA), $HNO_3$, or $NO_2$, or their non-stoichiometric formulas such as $MoO_x$, $WO_x$, or $VO_x$ (where x is a real number up to 5). The dopant layer may be applied after a patterned photoresist layer is applied, or the dopant layer can be applied across the substrate and then removed by etching. The dopant layer can be applied by ALD, CVD, or other processes such as spin casting. It is noted the dopant layer may be adsorbed by the semiconducting monolayer, rather than being a distinctly separate layer.

It is noted that the dopant layer contacts the exposed contact regions and/or the spacer regions of the semiconducting layer. The dopant layer may also contact the gate dielectric layer 230 and/or the gate terminal 270 in some embodiments of the present disclosure. However, the dopant layer 240 should not be present between the semiconducting layer 210 and the source/drain terminals 260, so as not to block the transport path. Put another way, the source/drain terminals 260 should directly contact the semiconducting layer 210.

Figure 3A:
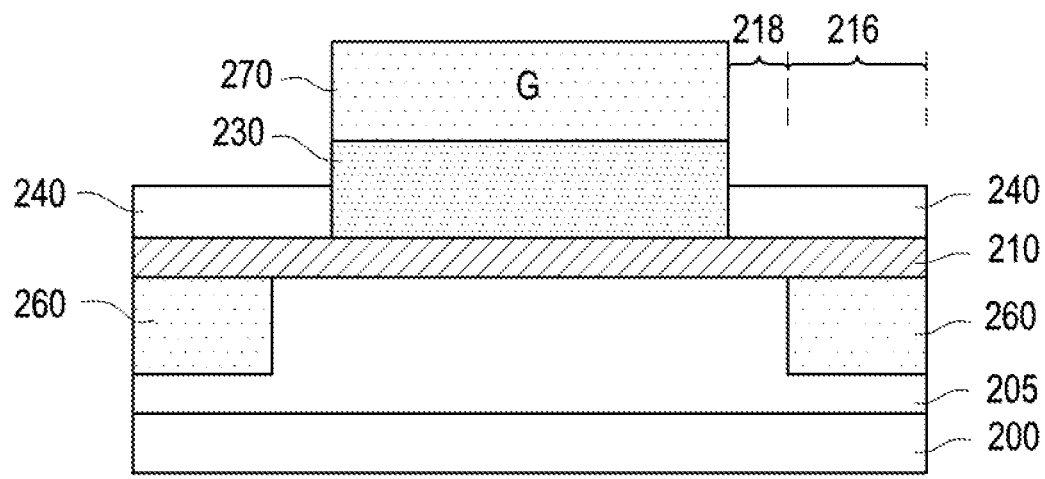
FIGS. 3A-3E are illustrations of various bottom-contact transistors that can be made as described in FIG. 1 in accordance with some embodiments.

FIG. 3A illustrates the final structure after step 140, which is a top-gate transistor 350. As illustrated here, the dopant layer 240 is applied to both the contact regions 216 and the spacer regions 218 of the semiconducting layer. The dopant layer 240 may have a thickness 245 of about 0.4 nanometers to about 200 nanometers. The gate terminal 270 may have a thickness 275 of about 1 nanometer to about 100 nanometers. The gate terminal 270 may have a length 271 of about 5 nanometers to about 1000 nanometers.

Figure 3B:
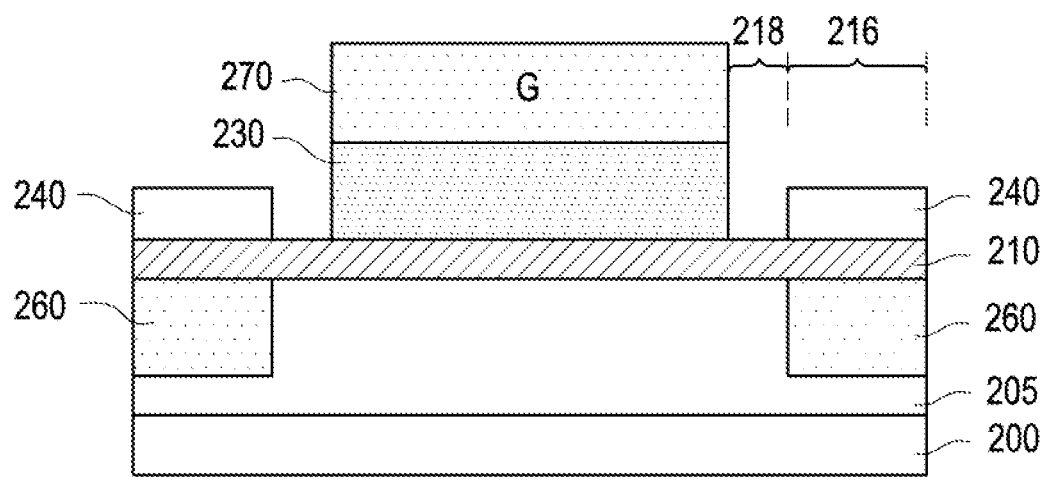

FIG. 3B illustrates another top-gate bottom-contact transistor 352. Here, the dopant layer is applied to only the contact regions 216 of the semiconducting layer. The dopant is not applied to the spacer regions 218.

Figure 3C:
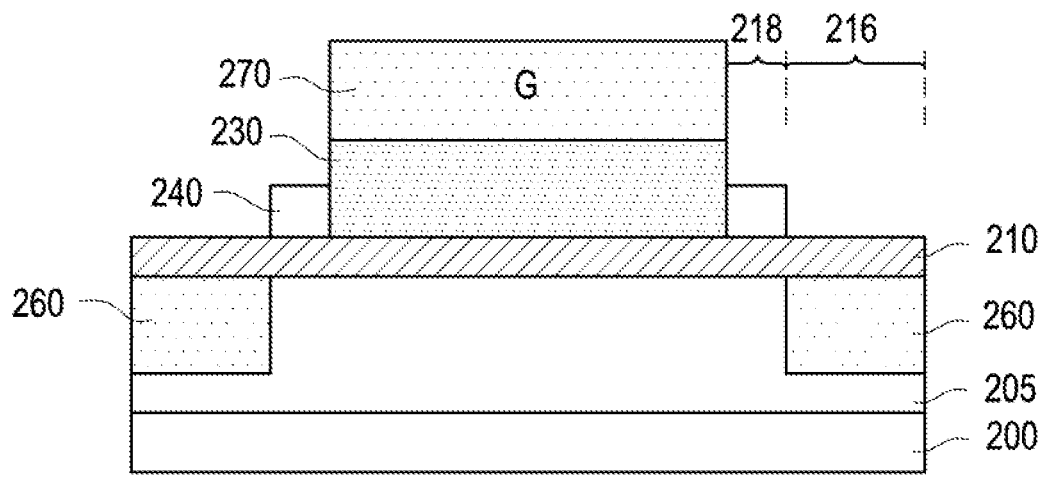

FIG. 3C illustrates another top-gate bottom-contact transistor 354. Here, the dopant layer is applied to only the spacer regions 218 of the semiconducting layer. The dopant is not applied to the contact regions 216.

If desired, different dopants can be applied to the contact regions and the spacer regions. However, the dopants should be the same type (p-type or n-type).

It is noted that step 140 for forming the dopant layer 240 could be performed prior to step 130 for forming the gate dielectric layer 230 and step 135 for forming the gate terminal 270. An appropriate patterned photoresist layer could be applied for this purpose.

Figure 3D:
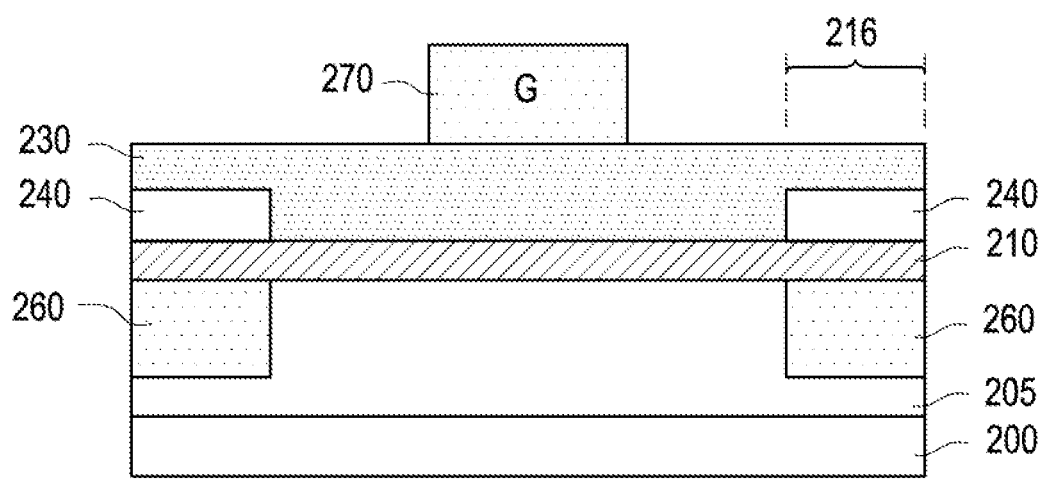

FIG. 3D illustrates a top-gate transistor 356. Here, the dopant layer 240 is first applied to the contact regions 216 of the semiconducting layer. The gate dielectric layer 230 is then applied over the semiconducting layer 210, including the contact regions 216. Due to this structure, there are no spacer regions in this transistor. The gate terminal 270 is then formed upon the gate dielectric layer 230.

Figure 3E:
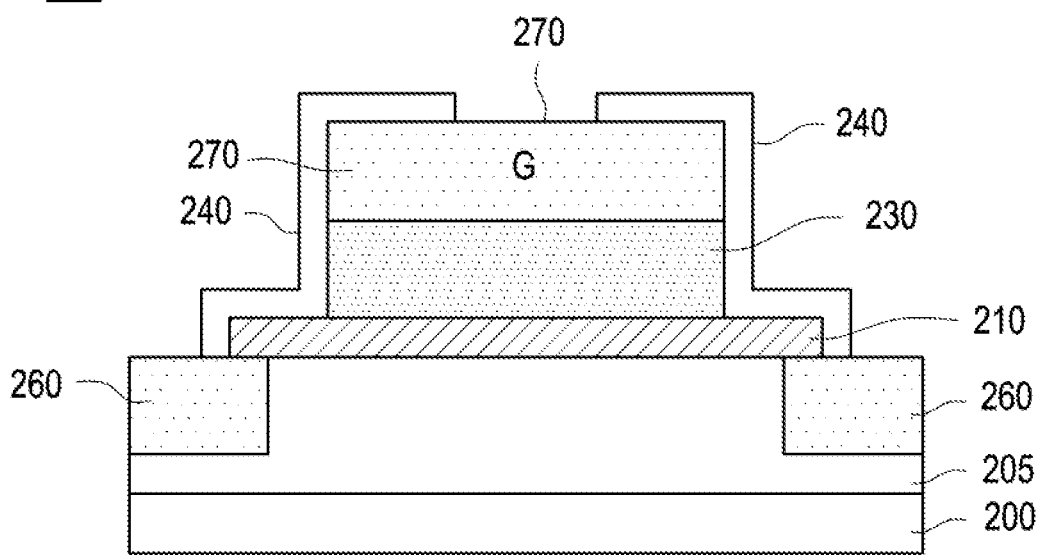

FIG. 3E illustrates another top-gate transistor 358. In this illustration, the semiconducting layer 210 does not fully cover the source/drain terminals 260. In addition, the dopant layer 240 was applied over the entire surface, and then etched to expose the source/drain terminals 260 and the gate terminal 270.

In particularly desirable embodiments of the present disclosure such as those illustrated in the cross-sectional views of FIGS. 3A-3E, the gate terminal 270 is separated from the source/drain terminals 260 by the semiconducting layer 210, or put another way they are on opposite surfaces of the semiconducting layer.

Figure 4:
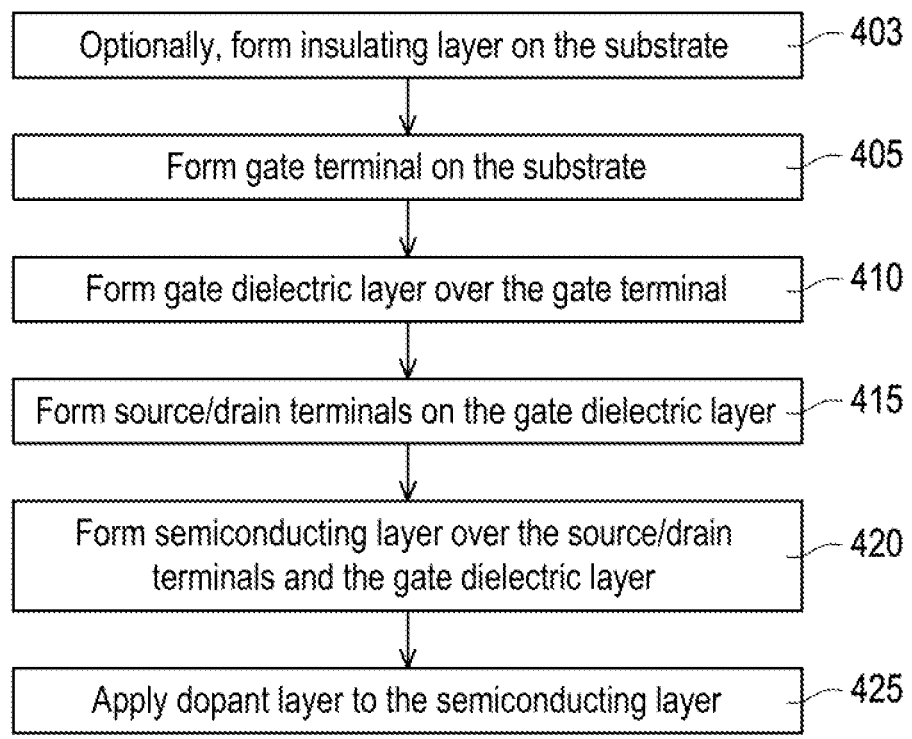
FIG. 4 is a flow chart illustrating a second method for making a transistor, in accordance with some embodiments.
Figure 5:
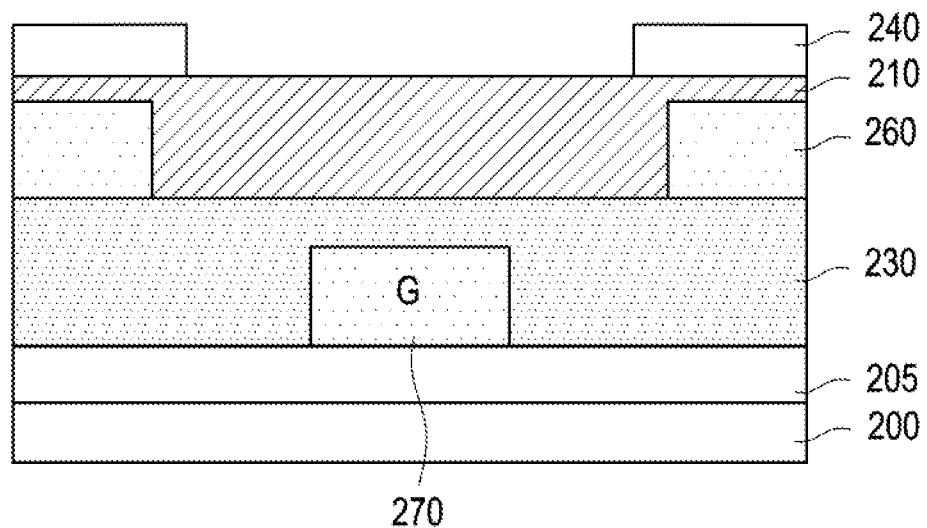
FIG. 5 is a bottom-contact transistor that can be made as described in FIG. 4 in accordance with some embodiments.

Continuing, FIG. 4 is a flow chart illustrating a second method 400 for making a transistor, in accordance with some embodiments of the present disclosure. In particular, this second method may be used to make a bottom-gate transistor. The steps are similar to those of FIG. 1, and are merely performed in a different order. The resulting transistor is illustrated in FIG. 5, and these two figures are discussed together.

In optional step 403, an insulating layer 205 is formed upon the substrate 200. In FIG. 5, the insulating layer 205 is shown.

In step 405, a gate terminal 270 is formed upon the substrate 200. If the insulating layer was formed, the gate terminal may be formed within the insulating layer, or can be formed on top of the insulating layer. In FIG. 5, the gate terminal 270 is formed on top of the insulating layer 205.

In step 410, a gate dielectric layer 230 is formed over the gate terminal.

Next, in step 415, source/drain terminals 260 are formed upon the gate dielectric layer 230.

Continuing, in step 420, a semiconducting layer 210 is formed over the source/drain terminals 260 and the gate dielectric layer 230.

Finally, in step 425, a dopant layer 240 is applied to the semiconducting layer 210. The resulting transistor 360 is shown in FIG. 5. As illustrated here, the dopant layer 240 is applied across the entire surface of the semiconducting layer 210. However, in other embodiments, the dopant layer 240 is applied to only the contact regions 216 of the semiconducting layer. This could be done by applying and patterning a photoresist layer prior to deposition of the dopant, or by etching the dopant layer afterwards.

Figure 6A:
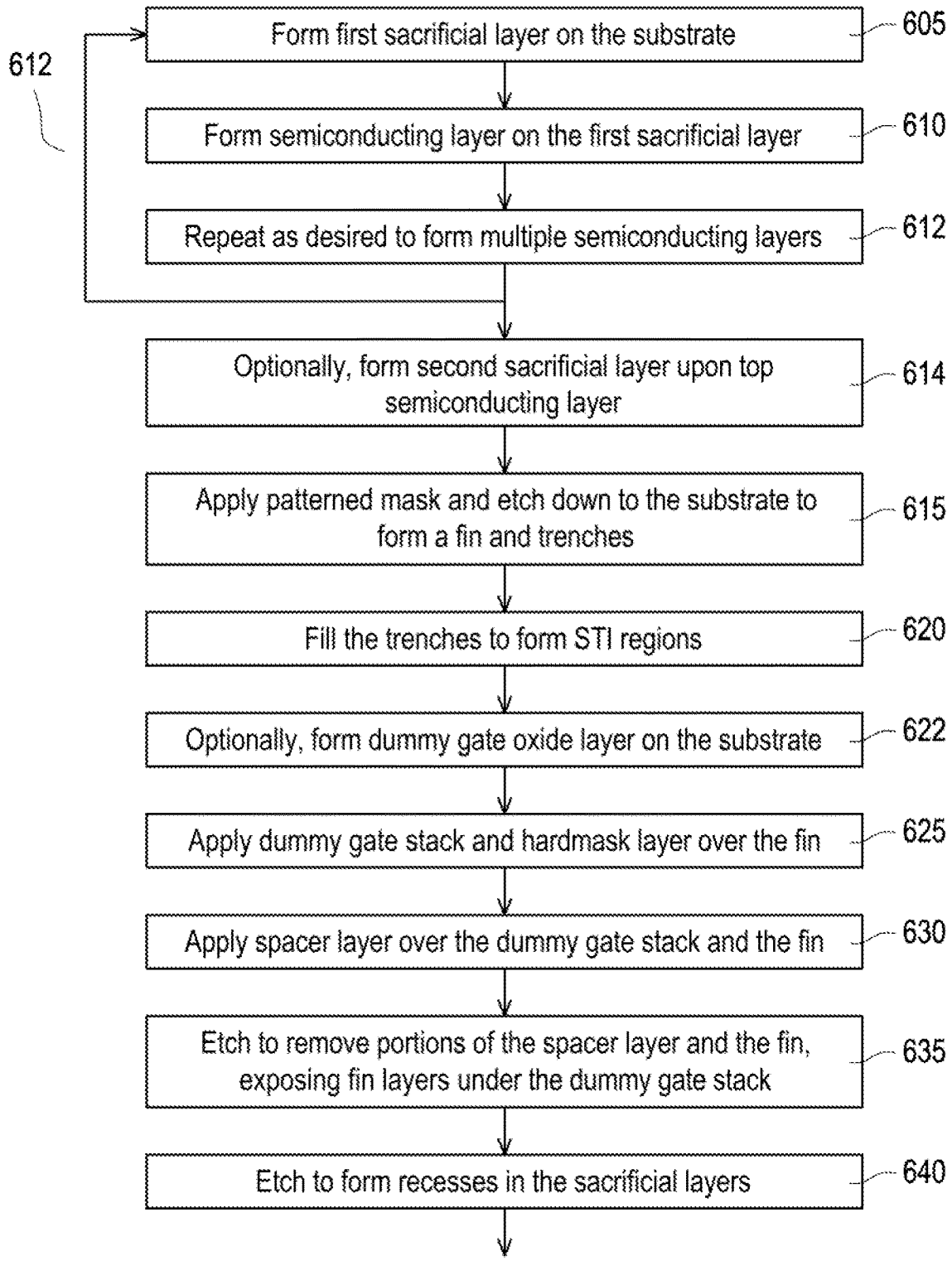
FIG. 6A and FIG. 6B together form a flow chart illustrating a third method for making a gate-all-around (GAA) transistor with one or more semiconducting layers, in accordance with some embodiments.
Figure 6B:
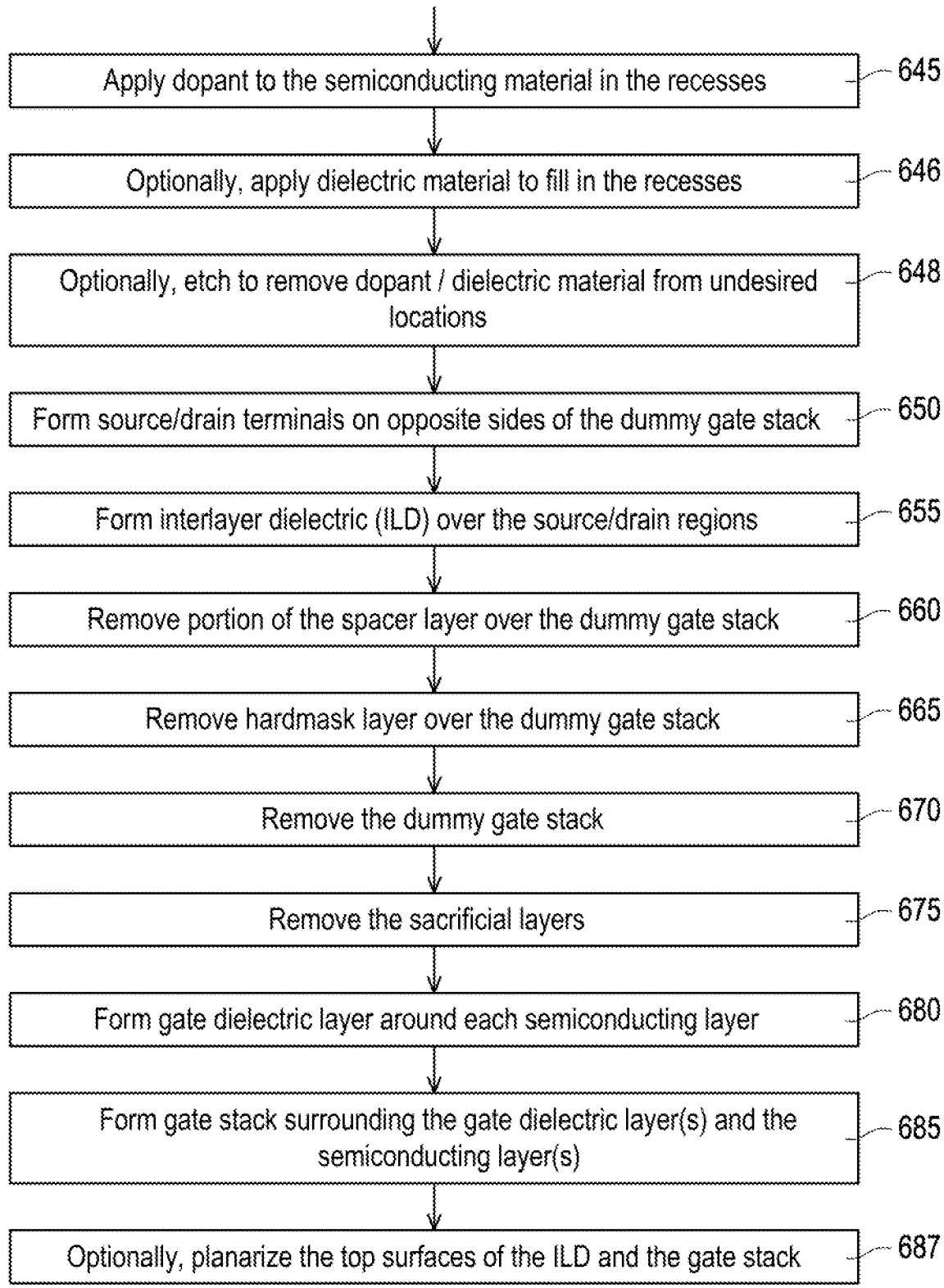
Figure 7A:
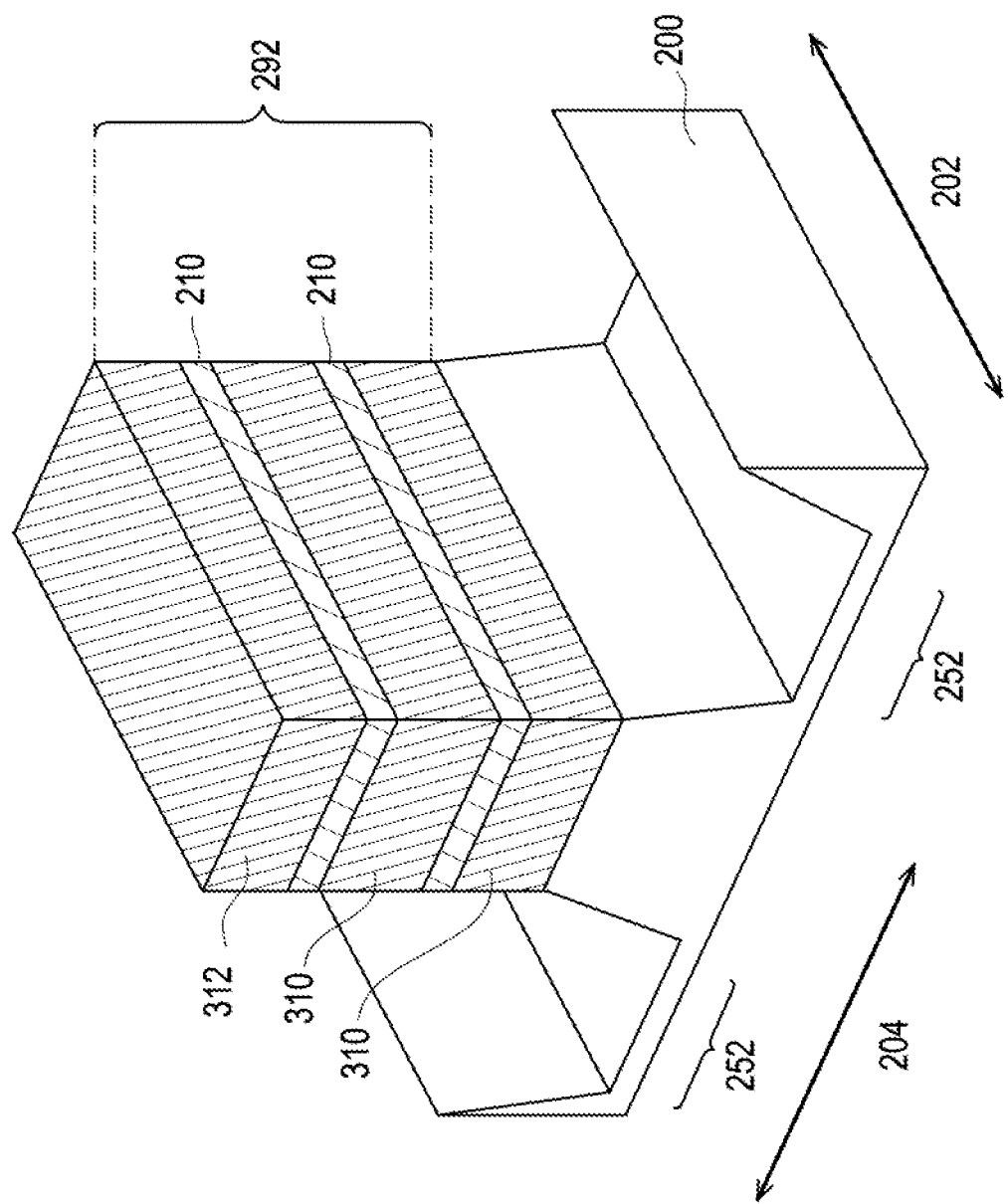
FIGS. 7A-7X illustrate various cross-sectional views of intermediate stages for forming the transistor as described in FIG. 6A and FIG. 6B.

FIG. 6A and FIG. 6B together form a flow chart illustrating a third method 600 for making a transistor, in accordance with some embodiments of the present disclosure. FIGS. 7A-7X illustrate various steps of the third method, and these figures are discussed together. These figures are illustrated with reference to a gate-all-around (GAA) transistor which can include one semiconducting channel or multiple semiconducting channels.

Referring now to FIG. 6A and FIG. 7A, in step 605, a first sacrificial layer 310 is formed upon the substrate 200. In step 610, a semiconducting layer 210 is formed upon the first sacrificial layer 310. These layers can be made using CVD, ALD, MBE, LPE, VPE, by transferring from a different surface as previously described, or any other appropriate process. Steps 605-610 can be repeated to create as many semiconducting channels as desired, with a sacrificial layer between each semiconducting channel, indicated by step 612.

Continuing, in optional step 614, a second sacrificial layer 312 is formed upon the top semiconducting layer 210. The second sacrificial layer is not always necessary, as will be seen later. The first sacrificial layers 310 and the second sacrificial layer 312 can be made of any suitable material which can be selectively etched in comparison to the other materials that will be used in the transistor, such as for example SiGe.

Next, a photoresist layer is applied over the substrate and patterned to form a mask. Then, in step 615, etching is performed through the mask down into the substrate 200 to form trenches 252. Each layer is etched using suitable etchants. The photoresist layer is then removed.

A fin 292 is thus formed from the combination of the first sacrificial layers 310, the semiconducting layers 210, and the second sacrificial layer 312. A perspective view of the resulting structure is shown in FIG. 7A, which is marked with a lateral direction 202 and a longitudinal direction 204.

Figure 7B:
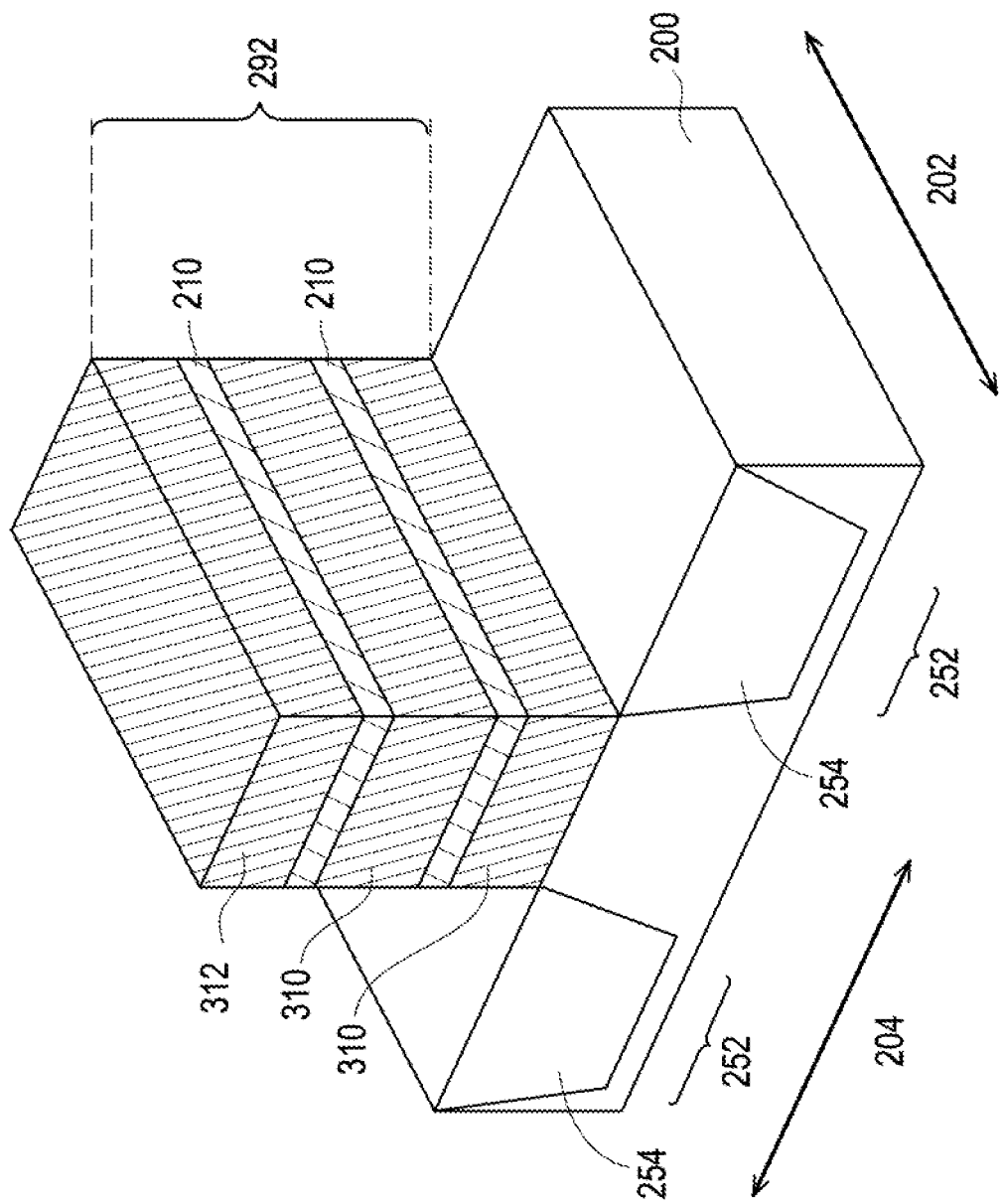

Next, in step 620 as illustrated in FIG. 7B, the trenches are filled with a dielectric material to form shallow trench isolation (STI) regions 254 between adjacent fins. The dielectric material in the STI region is commonly silicon dioxide, although other dielectric materials can also be used such as undoped polysilicon, silicon oxide, silicon nitride, silicon oxynitride, fluoride-doped silicate glass, or other low-k dielectric material. The deposition can be done using physical vapor deposition (PVD) or chemical vapor deposition (CVD) or spin-on processes known in the art, or can be grown via oxidation. If desired, the dielectric material can be deposited to a level above that of the first sacrificial layer, then recessed back down to the desired height by etching.

Figure 7C:
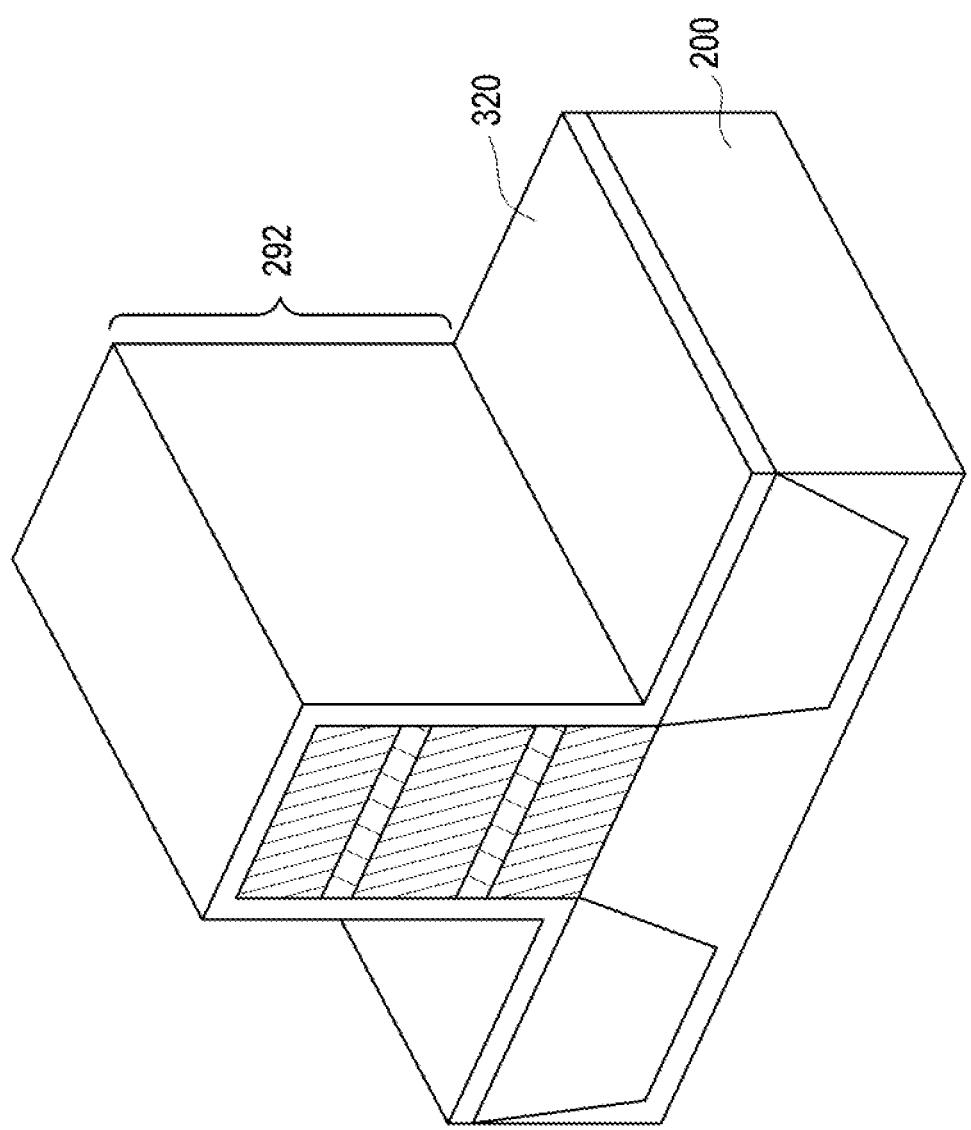

Next, in optional step 622, and as illustrated in FIG. 7C, a dummy gate oxide layer 320 is formed upon the substrate 200. This can be done using ALD, CVD, or other deposition processes. The dummy gate oxide layer 320 covers the horizontal surfaces and the vertical surfaces of the fin 292. Eventually, the dummy gate oxide layer is present only below a dummy gate stack and is removed from other surfaces.

Figure 7D:
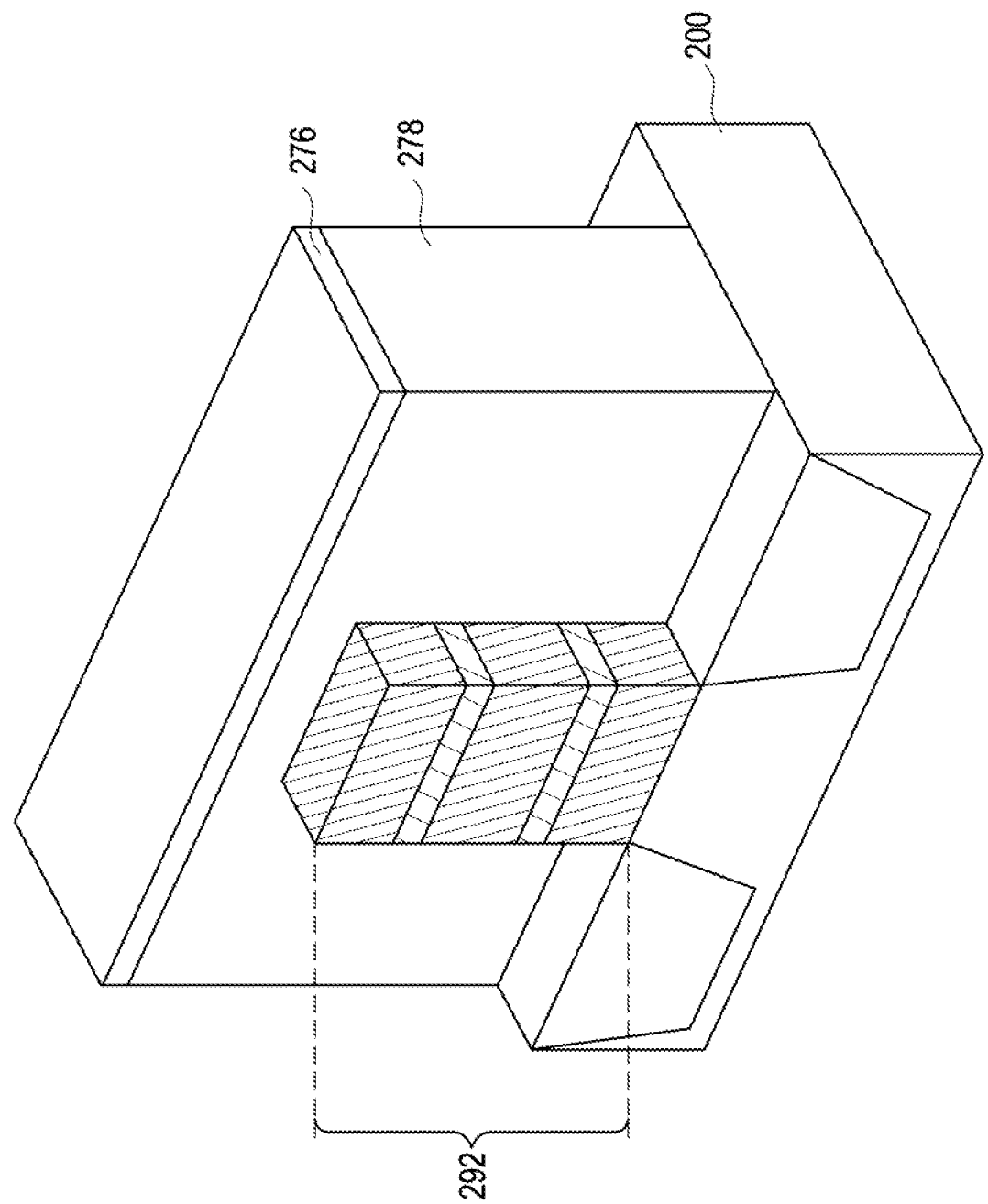

Continuing, in step 625, a dummy gate stack 278 is applied over the fin 292. The dummy gate stack may include a hardmask layer 276. The resulting structure is illustrated in FIG. 7D. It is noted that the optional dummy gate oxide layer is not illustrated in this figure or the following figures. However, after the hardmask layer 276 is applied, an etching step could be performed to remove the dummy gate oxide layer from the exposed surfaces not protected by the hardmask layer.

Figure 7E:
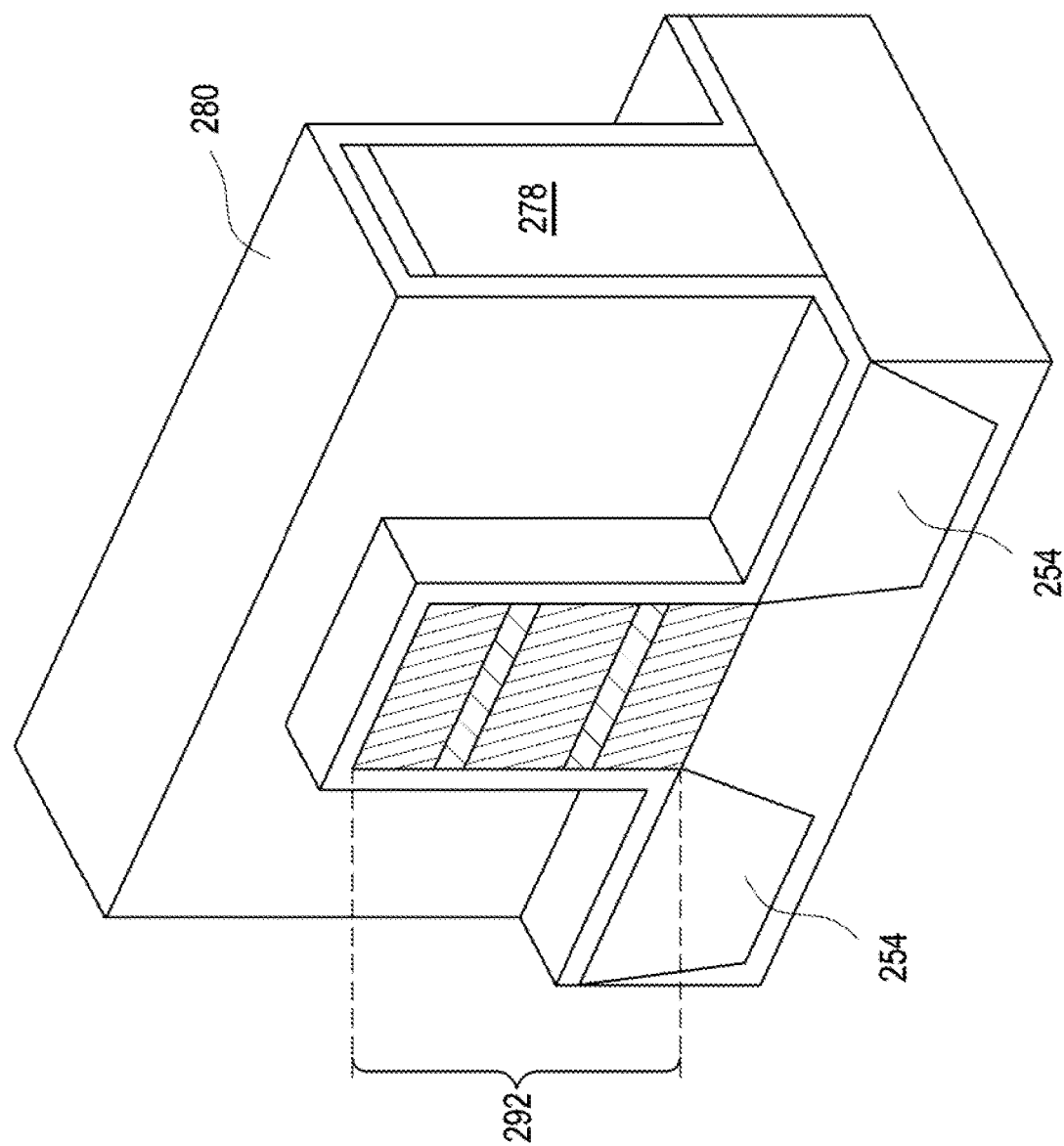

In subsequent step 630, a spacer layer 280 is applied over the dummy gate stack 278, the fin 292, and the STI regions 254. The resulting structure is illustrated in FIG. 7E.

Next, in step 635, the structure is anisotropically etched to remove portions of the spacer layer 280 and the fin 292. After the etching, as illustrated in FIG. 7F, the various layers of the fin 292 under the dummy gate stack 278 are exposed through the longitudinal surfaces of the spacer layer 280.

Figure 7F:
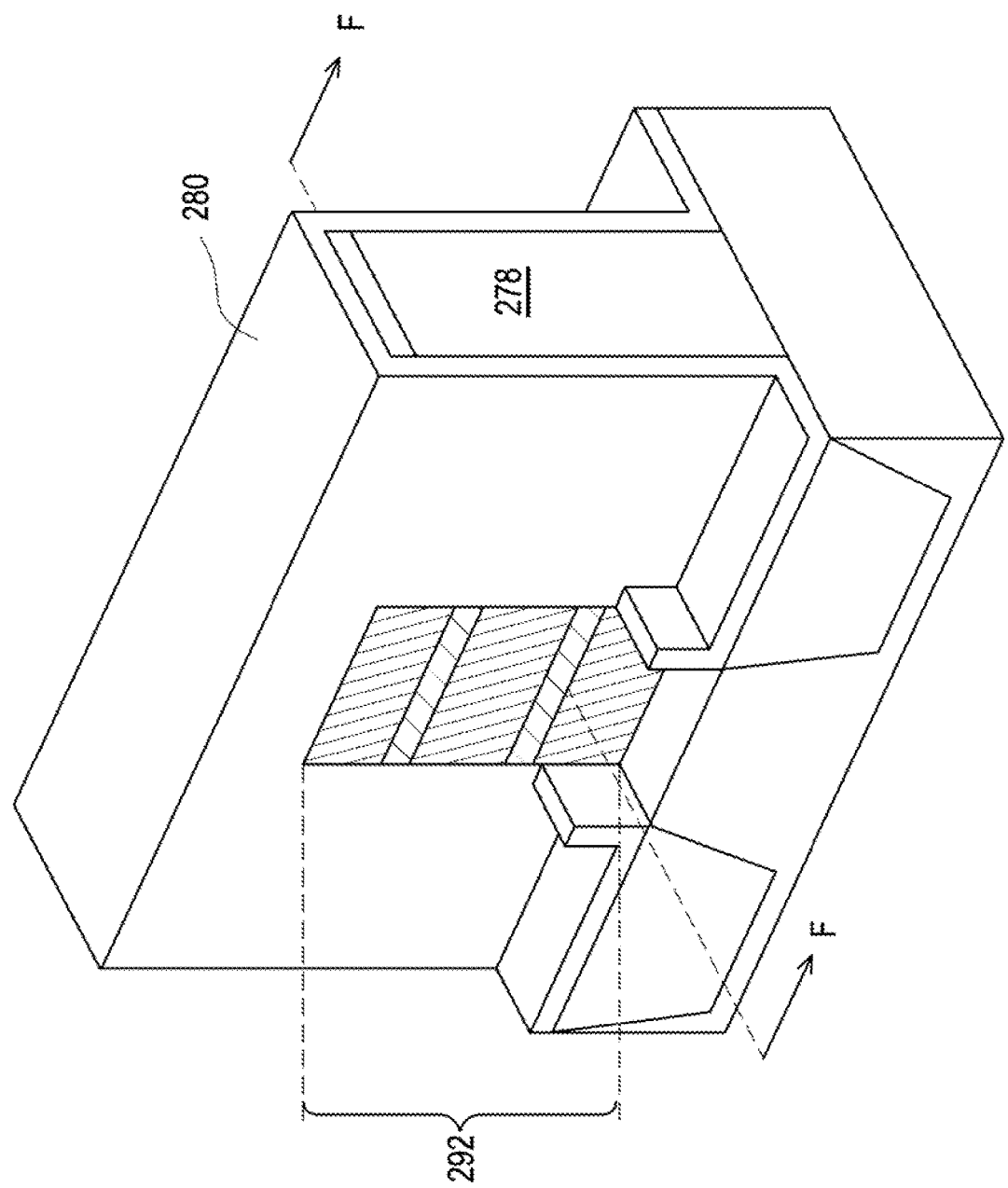
Figure 7H:
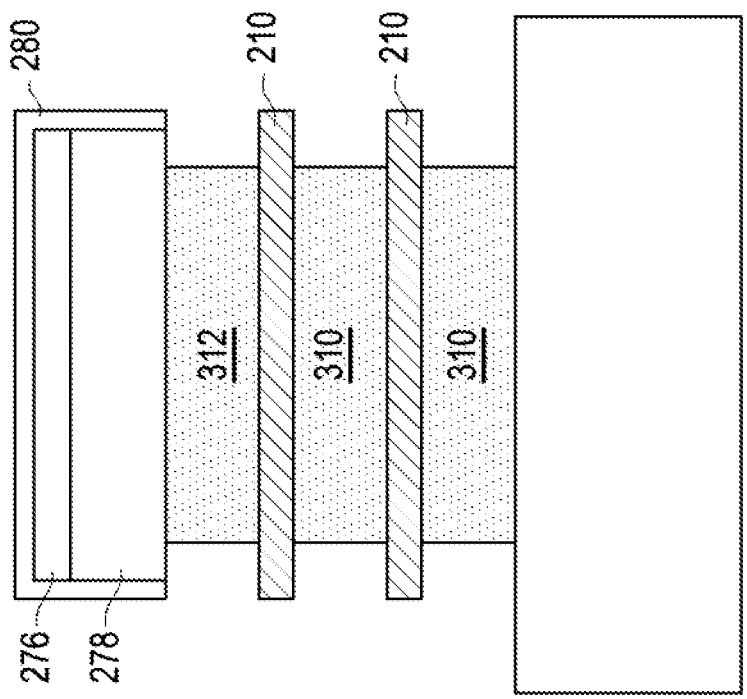
Figure 7G:
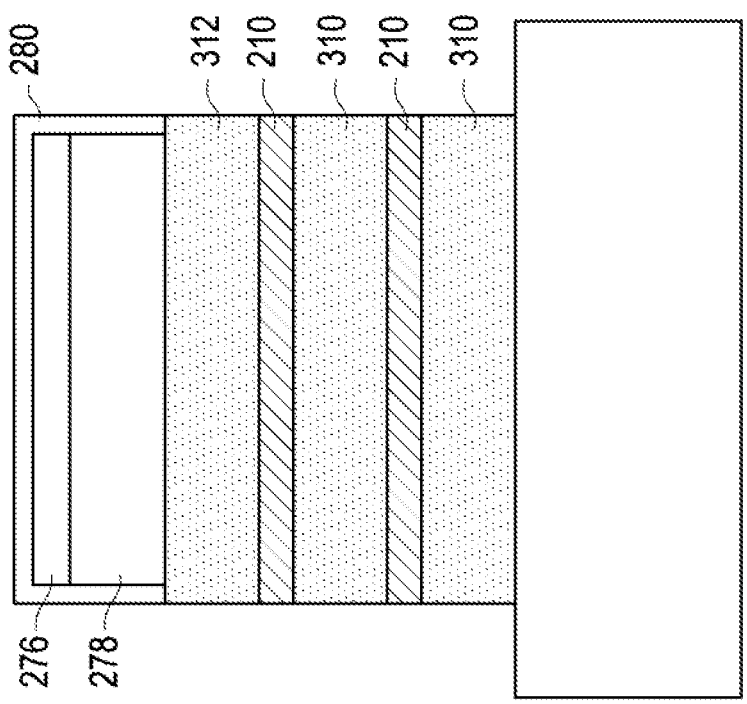

FIGS. 7G-7K are lateral cross-sectional views taken along line F-F in FIG. 7F. FIG. 7G is also a view of the structure after step 635.

Referring now back to FIG. 6, in step 640, an anisotropic etching process is used to form recesses in the exposed portions of the first sacrificial layers 310 and the second sacrificial layer 312. The resulting structure is illustrated in FIG. 7H.

Next, in step 645, a dopant layer 240 is applied to the semiconducting layers 210 within the recessed portions of the sacrificial layers 310, 312. The dopant layer may be any suitable material as previously described, and can be formed by any suitable deposition process. In FIG. 7I, the dopant layer is illustrated as a thin layer that does not fill the entire recess of the first sacrificial layers. However, in some particular embodiments, the dopant does fill in the recessed portions of the first sacrificial layers 310. The portions of the semiconducting layers to which the dopant layer is applied could be considered as both contact regions and spacer regions.

Figure 7J:
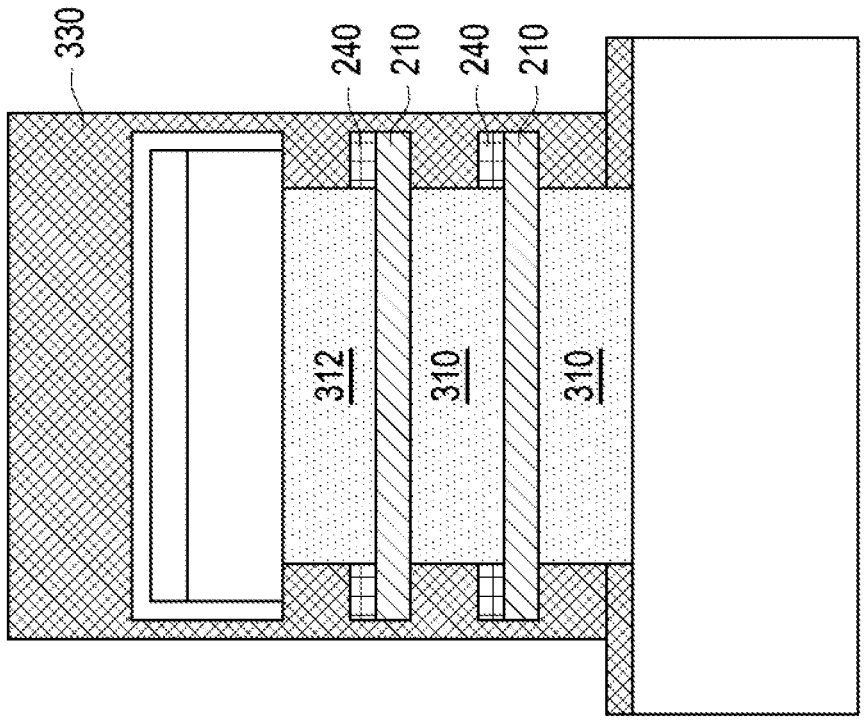
Figure 7I:
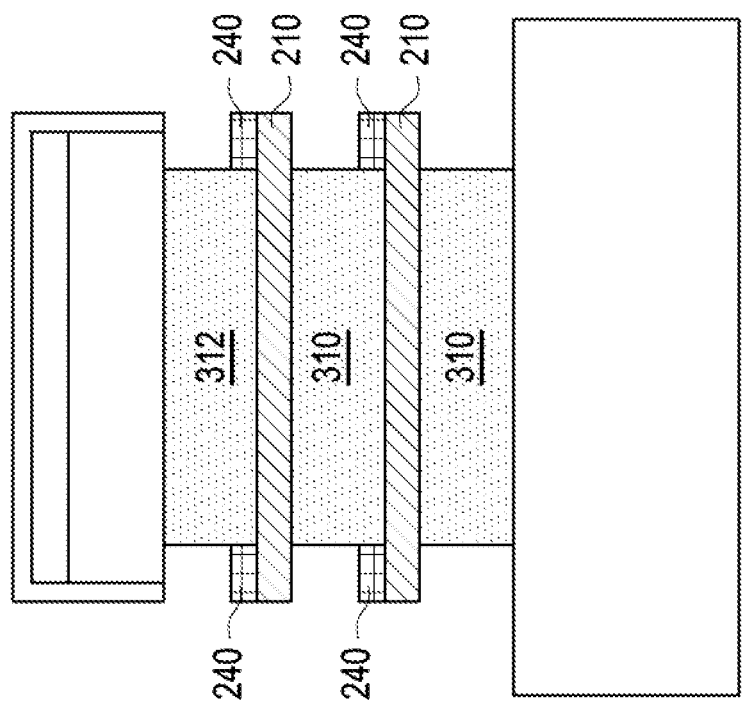
Figure 7L:
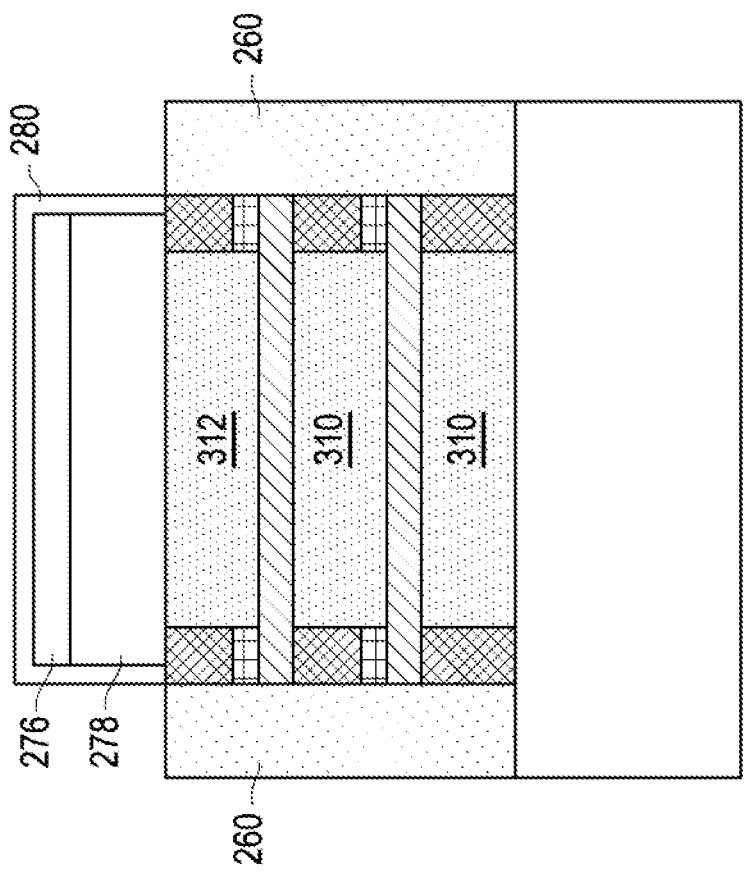

In following optional step 646, referring to FIG. 7J, another dielectric material 330 is formed to fill in the recessed portions of the sacrificial layers 310, 312. The dielectric material can be a low-k or high-k dielectric material, as desired, and may be formed by any suitable deposition process, such as ALD. Again, it is noted that the dopant could have been applied to fill the recessed portions entirely.

In separate optional step 648, anisotropic etching may be performed to remove the dopant layer 240/deposited dielectric material 330 from undesired locations.

Figure 7K:
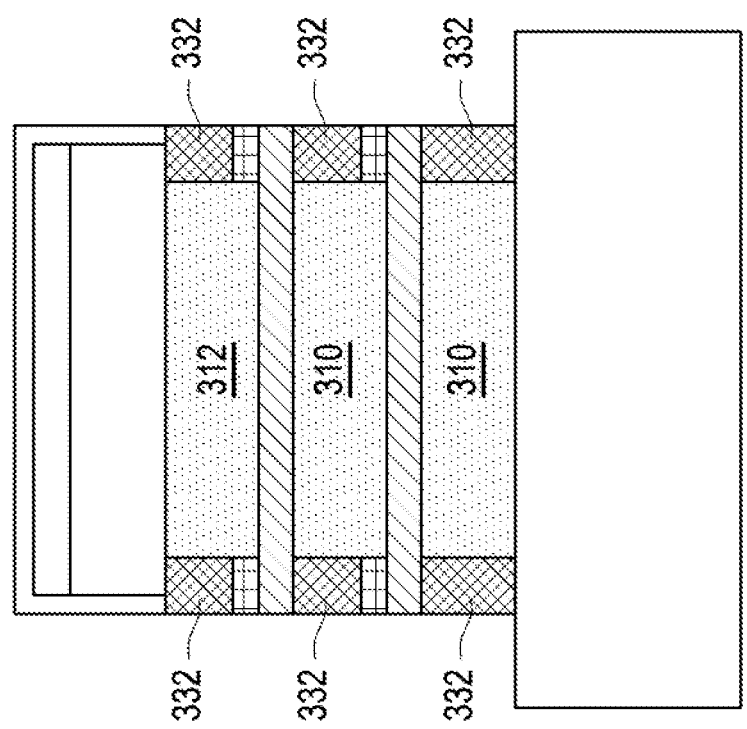

As a result of steps 645-648, referring to FIG. 7K, the recessed portions of the sacrificial layers 310, 312 are filled in, and may be considered to be inner spacers 332. These inner spacers isolate the gate stack from the source/drain regions and terminals formed in subsequent processing steps.

Figure 7M:
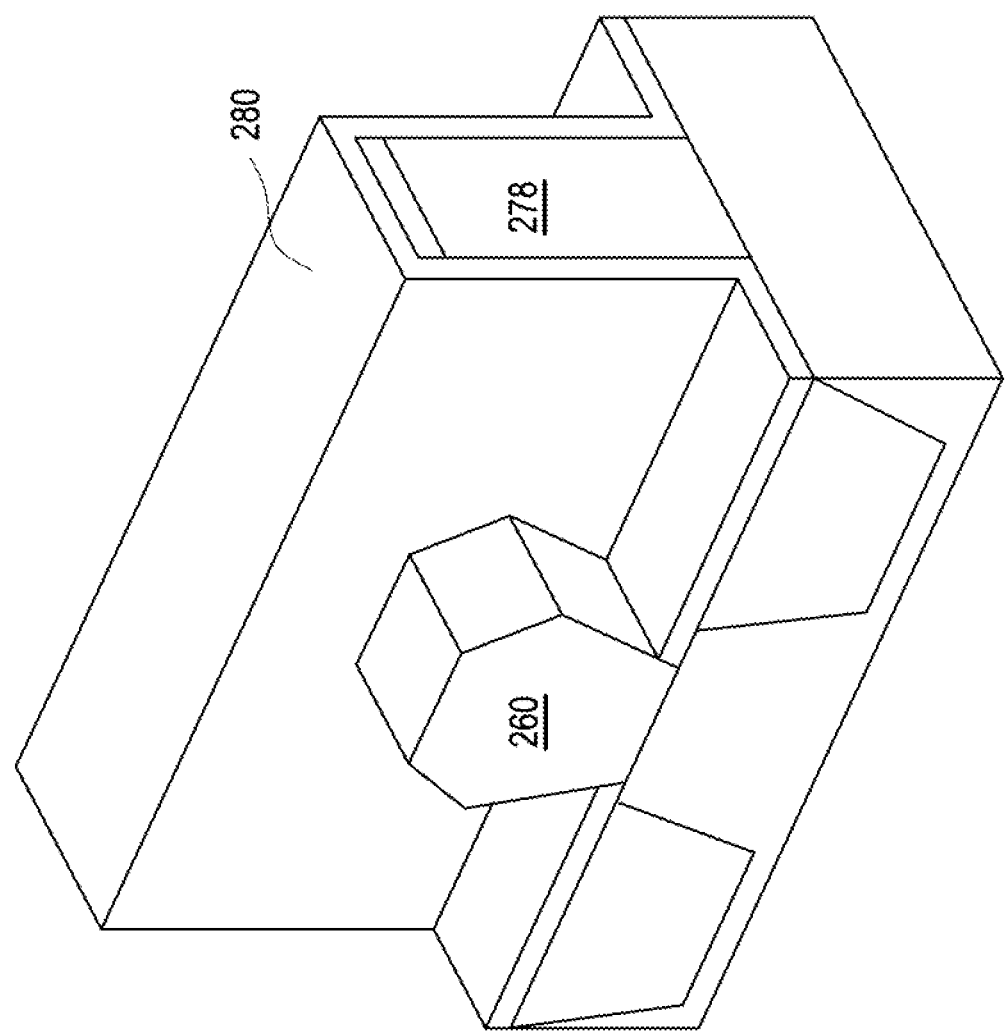

Next, in step 650, source/drain terminals 260 are formed on opposite sides of the dummy gate stack 278, adjacent to the exposed sides of the fin. FIG. 7L is a lateral cross-sectional view, and FIG. 7M is a perspective view after this step. The source/drain terminal is illustrated in FIG. 7M as a hexagon. The source/drain terminals 260 are separated from the dummy gate stack 278 by the spacer layer 280.

Subsequently, in step 655, an interlayer dielectric (ILD) 300 is formed in the source/drain regions 262, over the source/drain terminals 260. The resulting structure is shown in FIG. 7N.

Figure 7N:
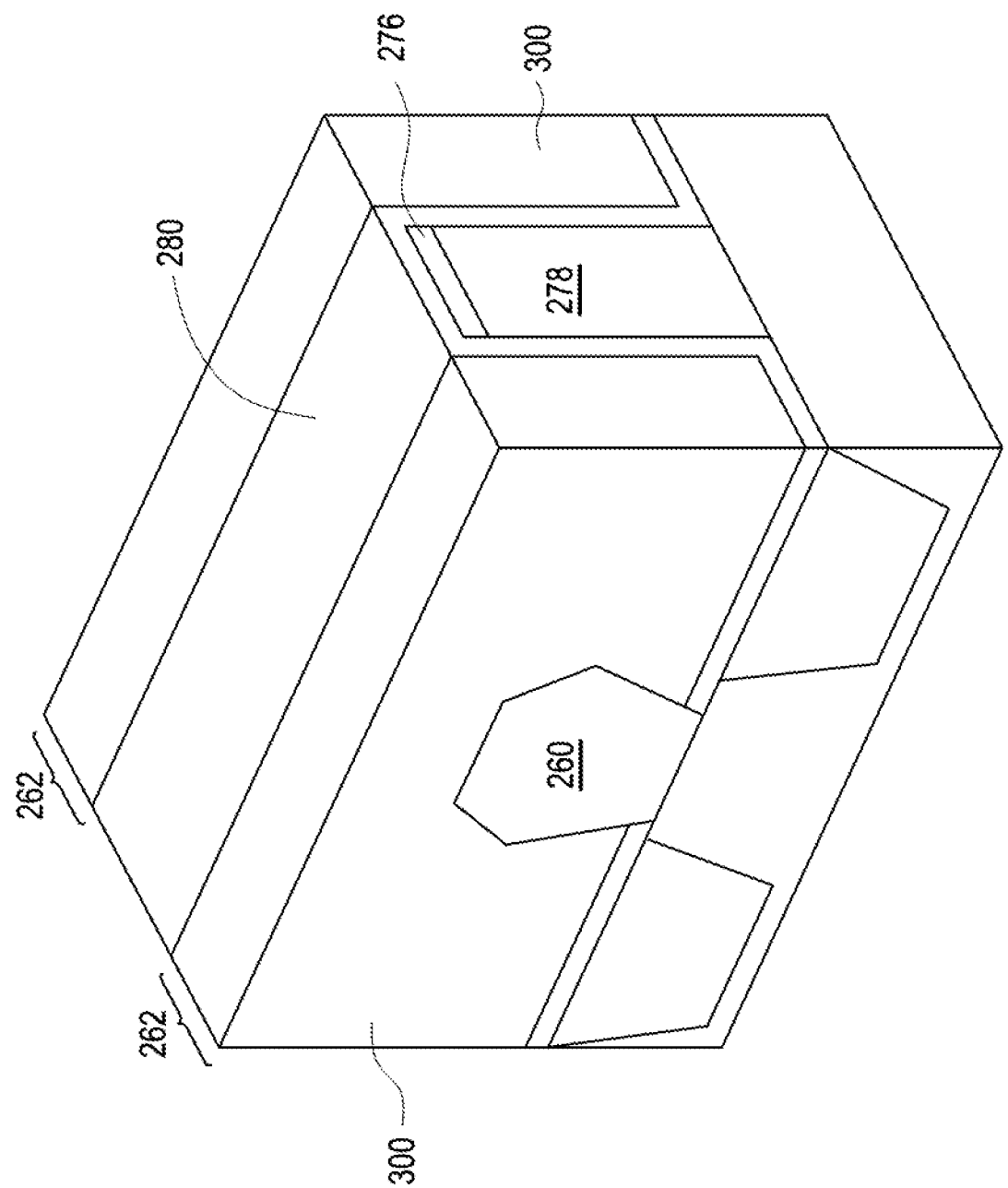
Figure 70:
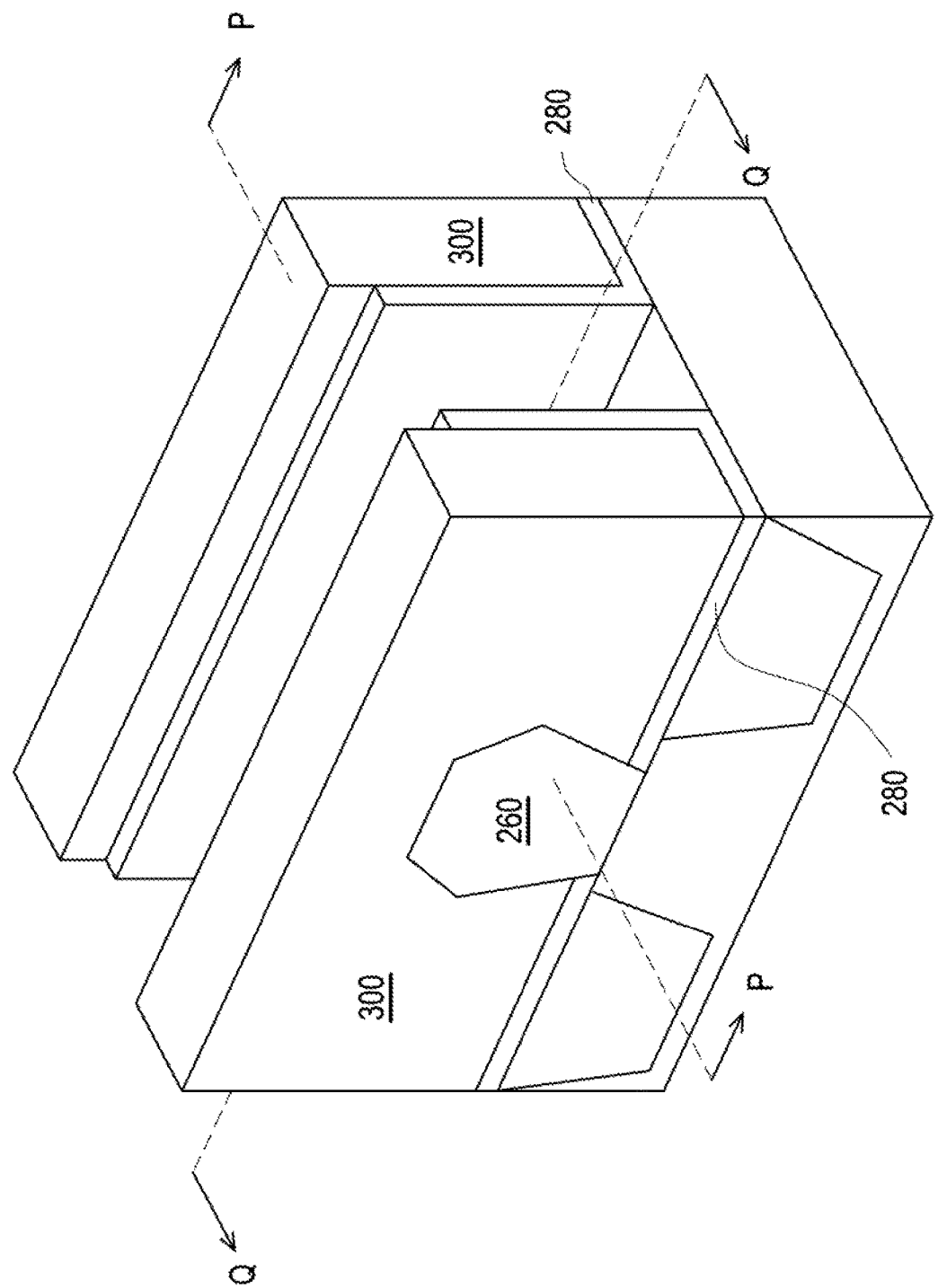

It is noted that in FIG. 7N, a horizontal portion of the spacer layer 280 covers the dummy gate stack 278. In step 660, that horizontal portion of the spacer layer 280 is removed from above the dummy gate stack 278. In step 665, the hardmask layer 276 is removed from above the dummy gate stack 278. In step 670, the dummy gate stack 278 is removed. The resulting structure is shown in FIG. 7O in a perspective view. These steps can be performed by wet etching, dry etching, or CMP as desired or appropriate. If the optional dummy gate oxide layer 320 is present, it can be used as an etch stop layer for the other layers, and then itself etched and removed.

FIG. 7P, FIG. 7R, FIG. 7T, and FIG. 7V are lateral cross-sectional views along line P-P of FIG. 7O. FIG. 7Q, FIG. 7S, FIG. 7U, and FIG. 7W are longitudinal cross-sectional views along line Q-Q of FIG. 7O.

FIG. 7P and FIG. 7Q show the resulting structure after step 670. The two semiconducting layers 210 are located between the first sacrificial layers 310 and the second sacrificial layer 312. The dopant 240 is also illustrated as part of the inner spacer 332.

Figure 7R:
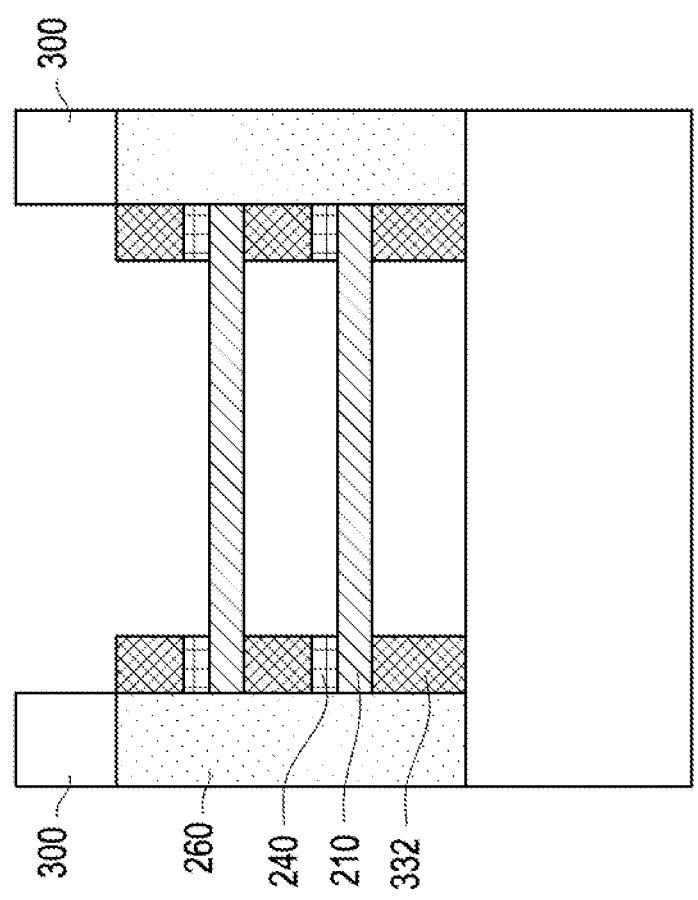
Figure 7S:
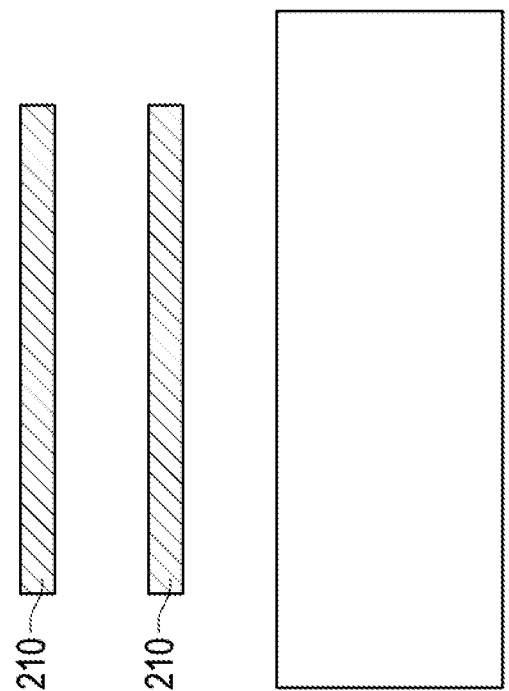
Figure 7W:
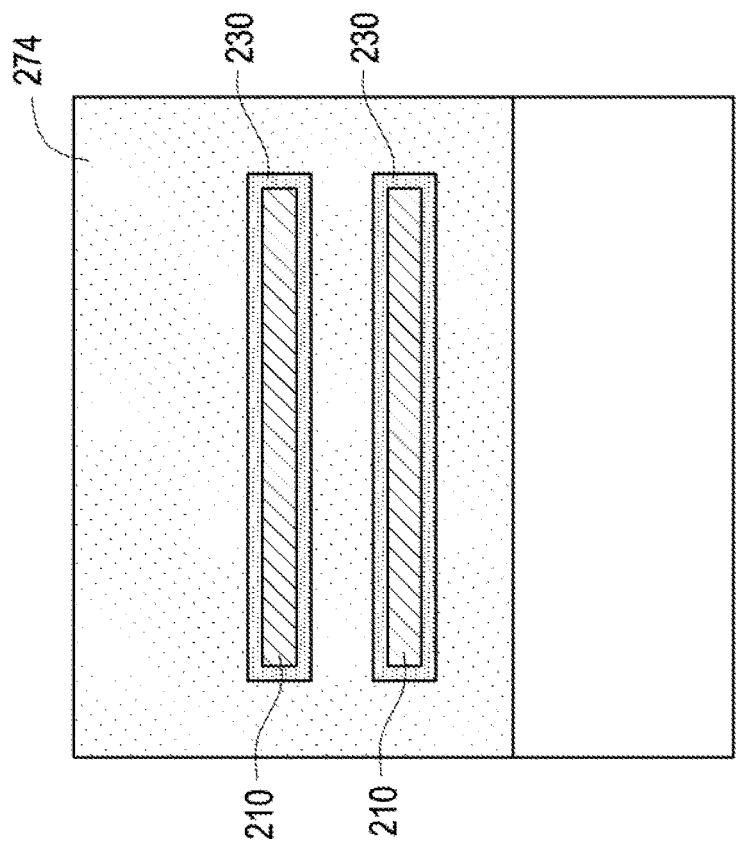

Continuing with FIG. 6, in step 675, the first sacrificial layers 310 and the second sacrificial layer 312 are removed. The resulting structure is shown in FIG. 7R and FIG. 7S. Please note that the middle of semiconducting layers 210 are suspended in FIG. 7R, and the semiconducting channels are supported at their ends, as seen in FIG. 7S.

With the removal of the first sacrificial layers 310 and the second sacrificial layer 312, the semiconducting layers 210 are exposed. It is noted that if the second sacrificial layer 310 was not present, the top semiconducting layer 210 would have become exposed after step 670, and would have been exposed in FIG. 7P and FIG. 7Q. Thus, as previously mentioned, the use of a second sacrificial layer 312 is optional.

Next, in step 680, a gate dielectric layer 230 is formed around each semiconducting layer 210. The gate dielectric layer can be made of any dielectric material, and may also be a high-k dielectric material as previously described. This may be done using any deposition process as previously described. Again, some damage may occur to the lateral edges of the semiconducting layers, but damage will not occur to the unexposed portions of the various semiconducting layers. The resulting structure is shown in FIG. 7T and FIG. 7U. It is noted that in FIG. 7T, the gate dielectric layer 230 is also present on the surfaces of the inner spacers 332 and the ILD 300, which are also dielectric materials, and thus this deposition is acceptable.

Figure 7V:
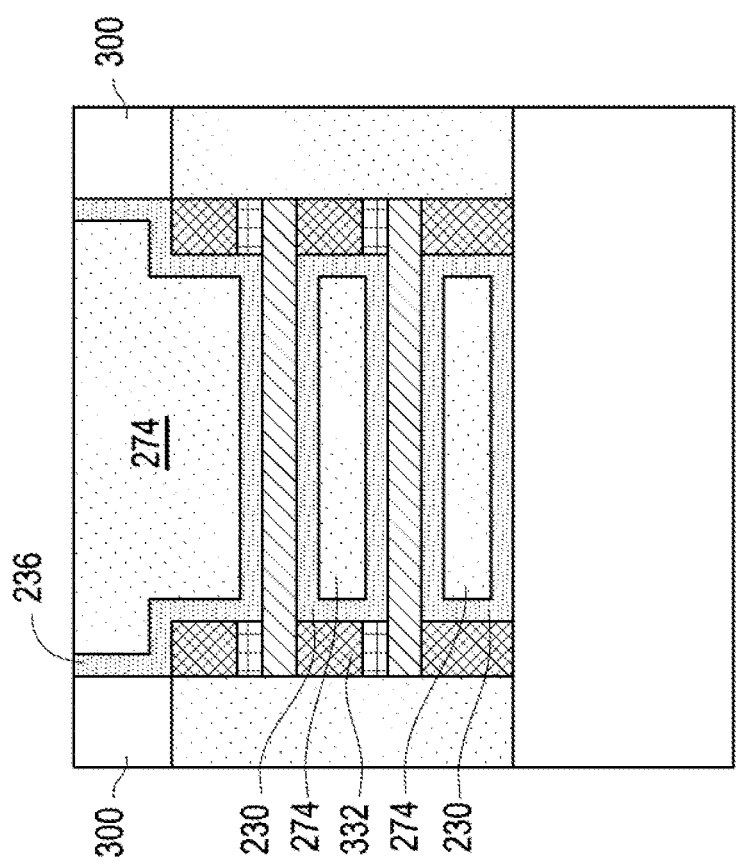
Figure 7X:
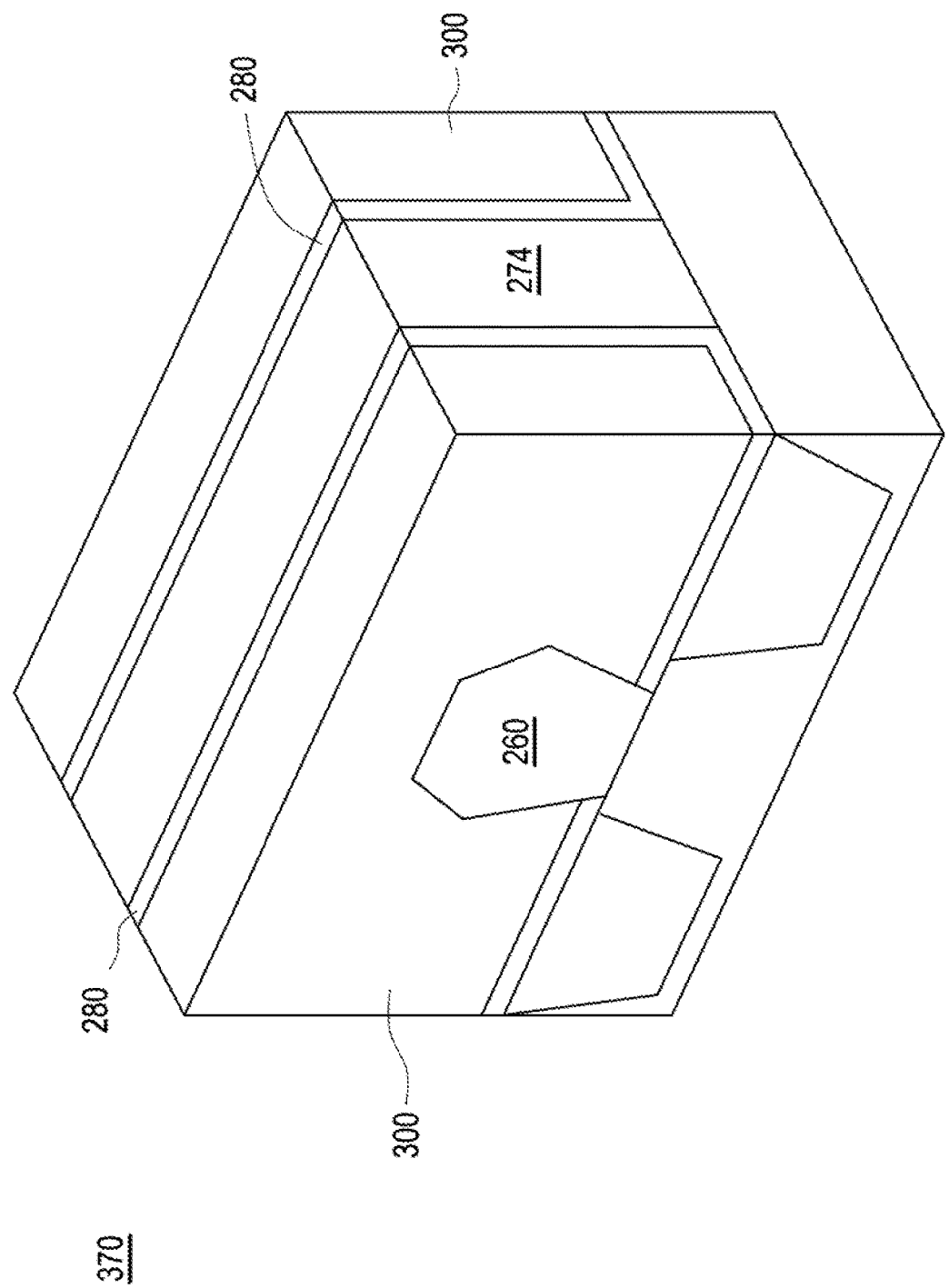

Next, in step 685, a gate stack 274 is formed upon the substrate in the space previously taken up by the dummy gate stack. The gate stack surrounds the gate dielectric layers 230 and the semiconducting channel 210. The gate stack 274 is located with the spacer layer 280 and the source/drain terminals 260 on each side thereof, and forms the gate terminal. The gate stack can be a multi-layered structure to tune the properties of the gate terminal as desired. The gate stack can be formed using ALD, CVD, sputtering, or the like. The resulting structure is shown in FIG. 7V and FIG.

7W. As can be seen in these figures, the gate material fills the remaining spaces around the semiconducting layers 210 and the gate dielectric layers 230.

If desired, in optional step 687, the top surface of the ILDs 300 and the gate stack 274 can be planarized to remove excess material. The resulting gate-all-around transistor 370 is shown in perspective view in FIG. 7X, and contains multiple semiconducting layers.

The methods of the present disclosure permit the doping of the semiconducting layers to reduce the contact resistance between the source/drain terminals and the semiconducting layer. Ion implantation is another effective method for doping the semiconducting layer to reduce the contact resistance. However, ion implantation will damage very thin semiconducting layers (such as monolayers). The present methods reduce or avoid such damage.

The Fermi-level pinning effect which can occur at the interface of a semiconductor and a metal is also advantageously reduced. Conceptually, the Schottky barrier height (SBH) at the semiconductor-metal interface is related to the work function of the metal. However, this is not always true for transitional metal dichalcogenides (TMDs), and interface states can result in Fermi-level pinning, wherein the SBH becomes unrelated to the work function. As a result, undesirable high contact resistance cannot be controlled by the choice of metal. The use of the dopant layer is believed to aid in depinning.

In the methods of the present disclosure, the semiconducting layer is also protected from exposure to metal deposition processes for making the various terminals. Thus, the semiconducting layer is not damaged by such processes.

The reduced pinning and low contact resistance result in a high-performance transistor in a two-dimensional system. With embedded terminals and the use of the dopant layer, the parallel capacitance between the source/drain terminals and the gate terminal is very low compared to a conventional top-contact structure.

Some embodiments of the present disclosure thus relate to methods for making a transistor. An insulating layer is formed on a substrate. Source/drain terminals are formed in the insulating layer. A semiconducting layer is formed over the source/drain terminals. A dopant layer is applied to the semiconducting layer. A gate dielectric layer is formed on the semiconducting layer. A gate terminal is formed on the gate dielectric layer.

Also disclosed are other methods for making a transistor. A gate terminal is formed upon a substrate. A gate dielectric layer is formed over the gate terminal. Source/drain terminals are formed upon the gate dielectric layer. A semiconducting layer is formed over the source/drain terminals. A dopant layer is applied to the semiconducting layer.

Also disclosed herein are methods for forming a gate-all-around transistor. A first sacrificial layer is formed upon a substrate. A semiconducting layer is formed upon the first sacrificial layer. Etching is performed through a patterned mask down to the substrate to form a fin. A dummy gate stack is applied over the fin. A spacer layer is applied over the dummy gate stack and the fin. Etching is performed to expose the fin through longitudinal surfaces of the spacer layer. Etching is performed to form recesses in the first sacrificial layer. A dopant layer is applied to the semiconducting layer in the recesses, wherein the dopant layer is a dielectric material that also forms inner spacers. Source/drain terminals are formed which contact the exposed fin and which are separated from the dummy gate stack by the second spacer layer. An interlayer dielectric is formed over the source/drain terminals. The spacer layer is removed from over the dummy gate stack. The dummy gate stack is then removed. The first sacrificial layer is then removed. A gate dielectric layer is formed around the semiconducting layer. A gate terminal is then formed around the gate dielectric layer.

Also disclosed herein are top-gate bottom-contact transistors. The transistors include a substrate. An insulating layer is present on the substrate. Source/drain terminals are formed in the insulating layer. A semiconducting layer is applied over the insulating layer and the source/drain terminals. A dopant layer is applied to the semiconducting layer over the source/drain terminals. A gate dielectric layer is present on the semiconducting layer. A gate terminal is formed on the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a transistor, comprising:
    forming an insulating layer on a substrate;
    forming source/drain terminals in the insulating layer;
    forming a semiconducting layer over the source/drain terminals;
    applying a dopant layer to the semiconducting layer such that a transport path between the source/drain terminals and the semiconducting layer is not blocked;
    forming a gate dielectric layer on the semiconducting layer; and
    forming a gate terminal on the gate dielectric layer.

2. The method of claim 1, wherein the dopant layer is applied to contact regions of the semiconducting layer; or
    wherein the dopant layer is applied to spacer regions of the semiconducting layer.

3. The method of claim 2, wherein each contact region has a length of about 3 nanometers to about 500 nanometers.

4. The method of claim 2, wherein each spacer region has a length of about 1 nanometer to about 100 nanometers.

5. The method of claim 1, wherein the insulating layer comprises $SiO_2$, $Si_3N_4$, a silicon oxynitride, SiC, $Al_2O_3$, a silicon carboxynitride, or hexagonal boron nitride (hBN).

6. The method of claim 1, wherein the semiconducting layer comprises $MoS_2$, $MoSe_2$, $WS_2$, $WSe_2$, $SnS_2$, $ReS_2$, InSe, phosphorene, tellurene, or graphene.

7. The method of claim 1, wherein the dopant layer comprises a silicon oxynitride, a titanium oxide, an aluminum oxide, cesium carbonate, polyethyleneimine, or benzyl viologen; or
    wherein the dopant layer comprises $MoO_3$, $WO_3$, $V_2O_5$, $AuCl_3$, $HAuCl_4$, F4TCNQ, TFSA, $HNO_3$, $NO_2$, $MoO_x$, $WO_x$, or $VO_x$.

8. The method of claim 1, wherein the gate dielectric layer comprises $HfO_2$, $ZrO_2$, $Al_2O_3$, $Y_2O_3$, $ErO_2$, hexagonal boron nitride (hBN), hafnium oxynitride, or zirconium oxynitride.

9. The method of claim 1, wherein the source/drain terminals and the gate terminal comprise TIN, Pt, Au, Co, Rh, Pd, Bi, Ti, or Ta.

10. The method of claim 1, wherein the semiconducting layer has a thickness of about 0.5 nanometers to about 10 nanometers.

11. The method of claim 1, wherein the gate dielectric layer has a thickness of about 0.5 nanometers to about 50 nanometers.

12. The method of claim 1, wherein the source/drain terminals have a thickness of about 5 nanometers to about 100 nanometers.

13. The method of claim 1, wherein the dopant layer has a thickness of about 0.4 nanometers to about 200 nanometers.

14. The method of claim 1, wherein the gate terminal has a thickness of about 1 nanometer to about 100 nanometers; or
wherein the gate terminal has a length of about 5 nanometers to about 1000 nanometers.

15. The method of claim 1, wherein the substrate comprises silicon, $Al_2O_3$, SiC, gallium nitride (GaN), gallium arsenide (GaAs), indium arsenide (InAs), or indium phosphide (InP).

16. The transistor produced by the method of claim 1.

17. A method for making a transistor, comprising:
forming a gate terminal upon a substrate;
forming a gate dielectric layer over the gate terminal;
forming source/drain terminals upon the gate dielectric layer;
forming a semiconducting layer over the source/drain terminals; and
applying a dopant layer to the semiconducting layer.

18. The method of claim 17, further comprising forming an insulating layer upon the substrate prior to forming the gate terminal.

19. A method for forming a gate-all-around transistor, comprising:
forming a first sacrificial layer upon a substrate;
forming a semiconducting layer upon the first sacrificial layer;
etching through a patterned mask down to the substrate to form a fin;
applying a dummy gate stack over the fin;
applying a spacer layer over the dummy gate stack and the fin;
etching to expose the fin through longitudinal surfaces of the spacer layer;
etching to form recesses in the first sacrificial layer;
applying a dopant layer to the semiconducting layer in the recesses, wherein the dopant layer is a dielectric material that also forms inner spacers;
forming source/drain terminals which contact the exposed fin and which are separated from the dummy gate stack by the spacer layer;
forming an interlayer dielectric over the source/drain terminals;
removing the spacer layer over the dummy gate stack;
removing the dummy gate stack;
removing the first sacrificial layer;
forming a gate dielectric layer around the semiconducting layer; and
forming a gate terminal around the gate dielectric layer.

20. The method of claim 19, further comprising forming a second sacrificial layer upon the semiconducting layer prior to etching through the patterned mask.

* * * * *